United States Patent
Wachter et al.

(10) Patent No.: US 9,718,678 B2
(45) Date of Patent: Aug. 1, 2017

(54) PACKAGE ARRANGEMENT, A PACKAGE, AND A METHOD OF MANUFACTURING A PACKAGE ARRANGEMENT

(71) Applicant: Infineon Technologies AG, Neubiberg (DE)

(72) Inventors: Ulrich Wachter, Regensburg (DE); Thomas Kilger, Regenstauf (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 57 days.

(21) Appl. No.: 14/495,920

(22) Filed: Sep. 25, 2014

(65) Prior Publication Data
US 2016/0090294 A1   Mar. 31, 2016

(51) Int. Cl.
*H01L 23/02* (2006.01)
*B81C 1/00* (2006.01)

(52) U.S. Cl.
CPC ... *B81C 1/00238* (2013.01); *H01L 2224/16225* (2013.01); *H01L 2224/18* (2013.01); *H01L 2924/181* (2013.01)

(58) Field of Classification Search
CPC ........... H01L 2224/96; H01L 2924/181; H01L 2224/73253; H01L 24/96; H01L 2924/14
USPC ....... 257/758, 723, 724, 686, 778, 784, 786, 257/659; 438/106, 107, 108, 109, 125, 438/126, 127
See application file for complete search history.

(56) References Cited

U.S. PATENT DOCUMENTS

| | | | |
|---|---|---|---|
| 8,901,755 B2 * | 12/2014 | Chi | H01L 21/561 257/666 |
| 2011/0024888 A1 | 2/2011 | Pagaila et al. | |
| 2013/0249104 A1 | 9/2013 | Chi et al. | |
| 2014/0036464 A1 | 2/2014 | Kilger | |
| 2014/0110858 A1 | 4/2014 | Beer et al. | |

(Continued)

FOREIGN PATENT DOCUMENTS

| | | |
|---|---|---|
| CN | 101989558 A | 3/2011 |
| CN | 103779319 A | 5/2014 |

(Continued)

*Primary Examiner* — S. V. Clark
(74) *Attorney, Agent, or Firm* — Viering, Jentschura & Partner MBB

(57) ABSTRACT

According to various embodiments, a package arrangement may include: a first encapsulation material; at least one electronic circuit at least partially embedded in the first encapsulation material, the at least one electronic circuit including a first contact pad structure at a first side of the at least one electronic circuit; at least one electromechanical device disposed over the first side of the at least one electronic circuit, the at least one electromechanical device including a second contact pad structure facing the first side of the at least one electronic circuit; a redistribution layer structure between the at least one electromechanical device and the at least one electronic circuit, the redistribution layer structure electrically connecting the first contact pad structure with the second contact pad structure, wherein a gap is provided between the at least one electromechanical device and the redistribution layer structure; a second encapsulation material at least partially covering the at least one electromechanical device, wherein the gap is free of the second encapsulation material.

17 Claims, 12 Drawing Sheets

(56) References Cited

U.S. PATENT DOCUMENTS

| | | | |
|---|---|---|---|
| 2014/0151797 A1* | 6/2014 | Lotfi | H01L 23/4824 |
| | | | 257/338 |
| 2014/0264808 A1 | 9/2014 | Wolter et al. | |
| 2015/0179555 A1* | 6/2015 | Kim | H01L 21/486 |
| | | | 257/676 |

FOREIGN PATENT DOCUMENTS

| | | |
|---|---|---|
| CN | 104051364 A | 9/2014 |
| DE | 102013108352 A1 | 2/2014 |

* cited by examiner

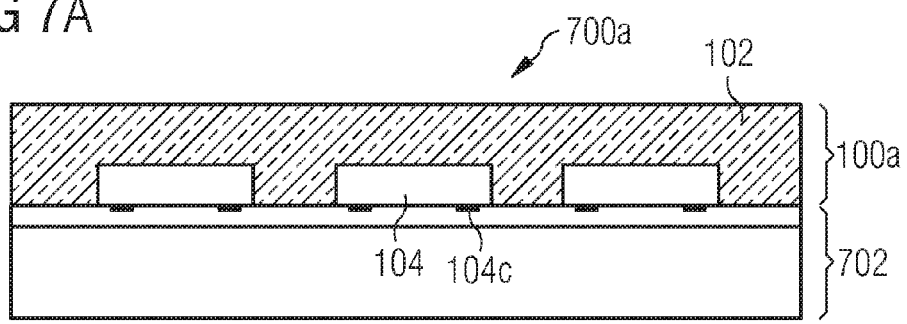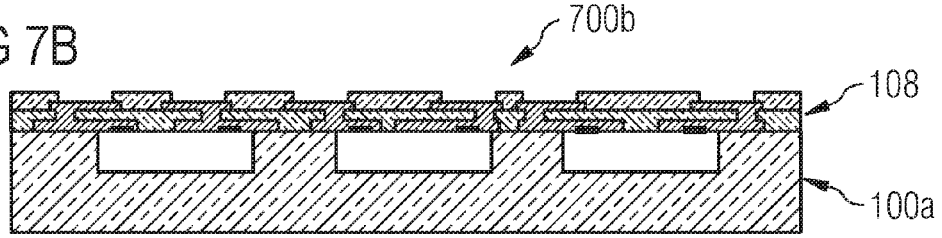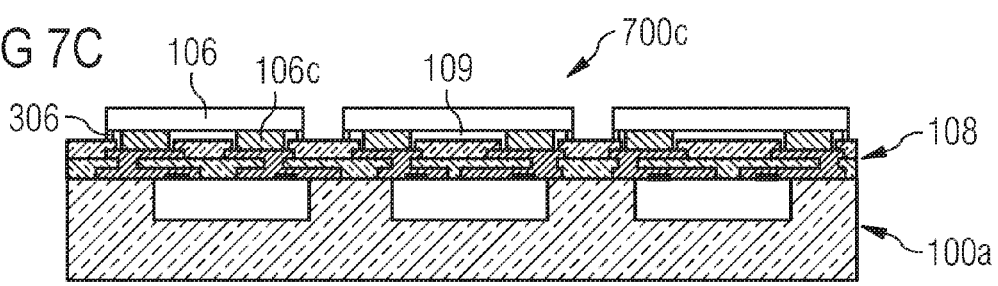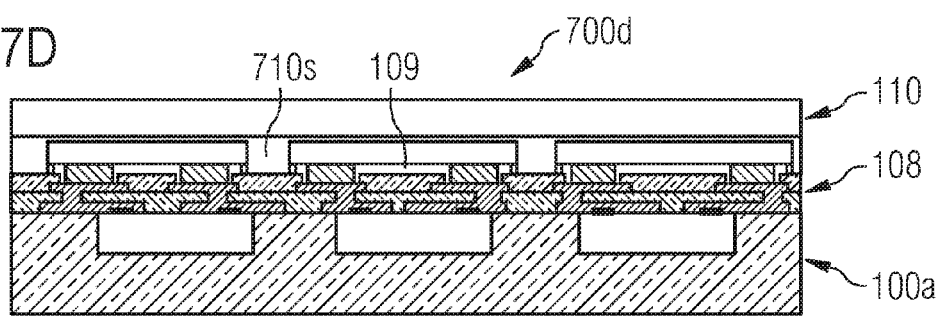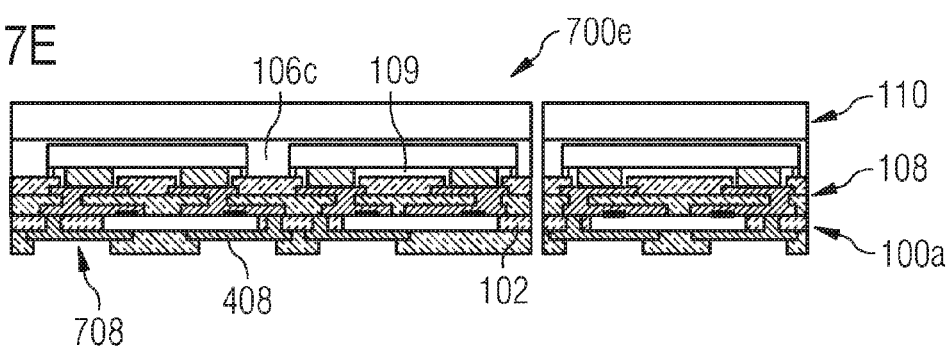

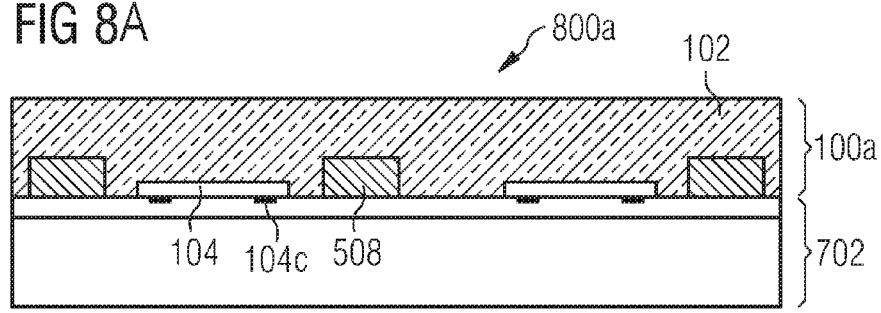
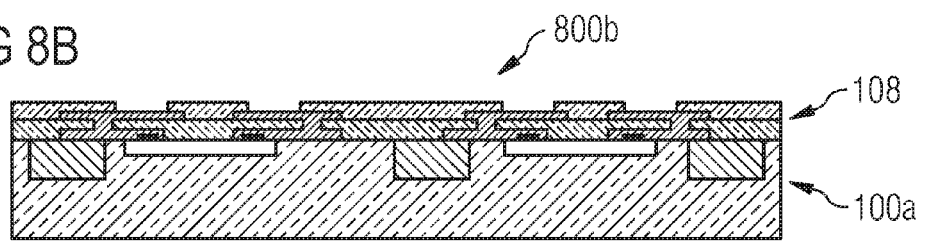
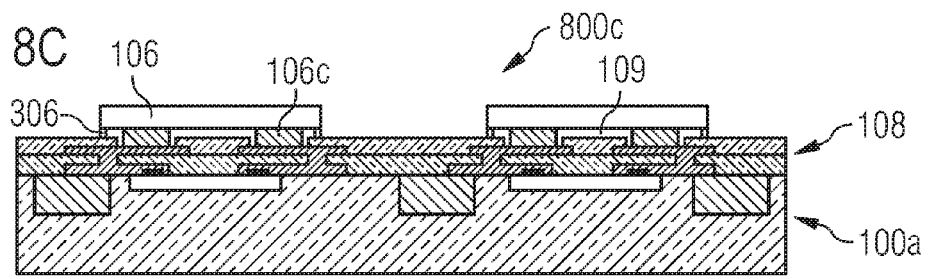
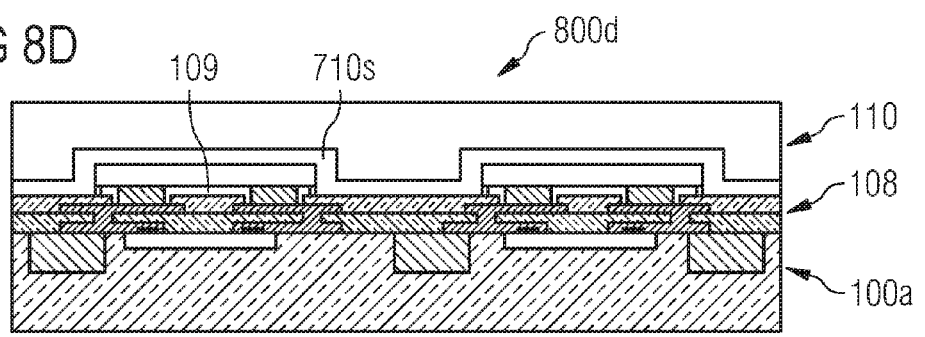
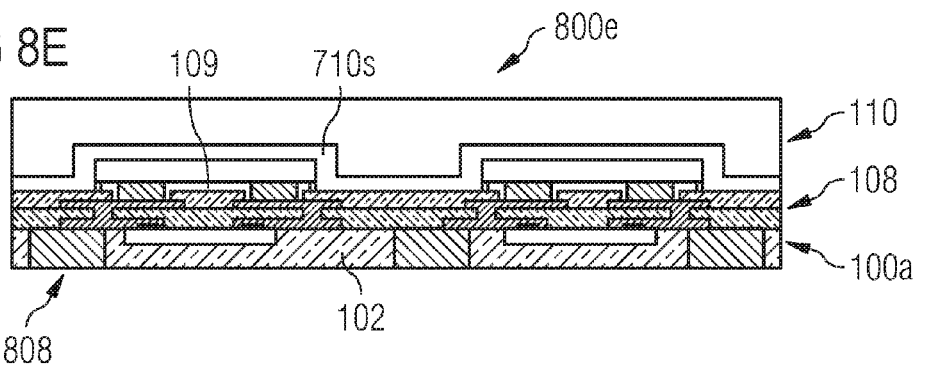

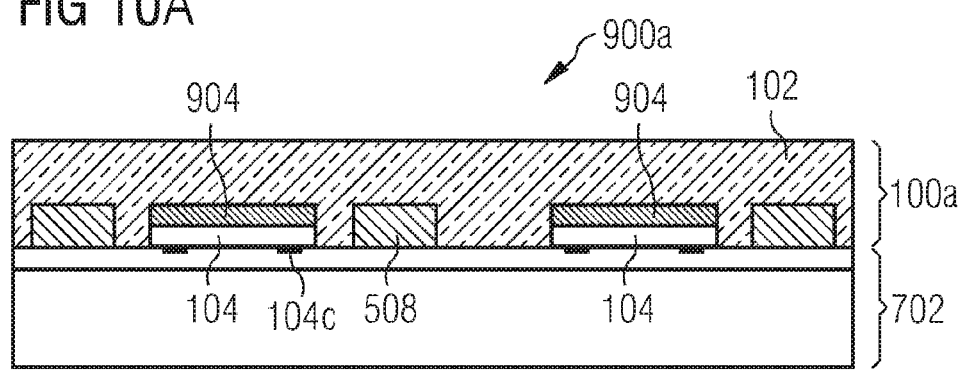
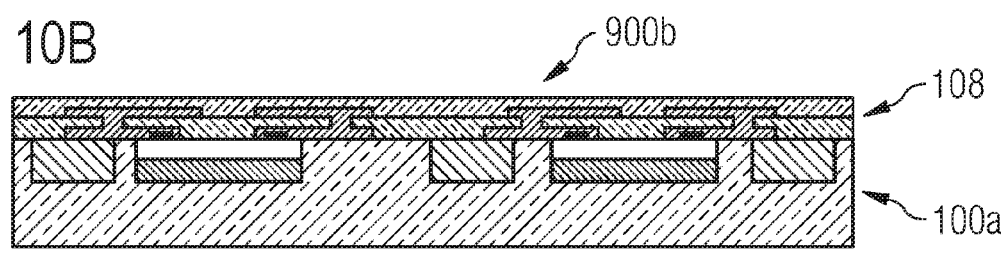
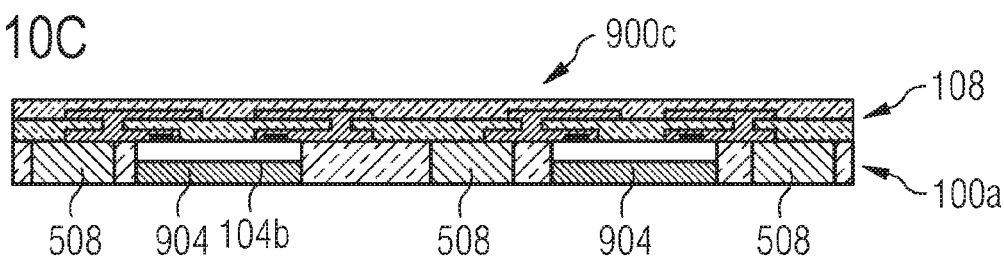

PACKAGE ARRANGEMENT, A PACKAGE, AND A METHOD OF MANUFACTURING A PACKAGE ARRANGEMENT

TECHNICAL FIELD

Various embodiments relate generally to a package arrangement, a package, and a method of manufacturing a package arrangement.

BACKGROUND

In general, one or more electronic circuits, e.g. integrated circuits, dies, chips or integrated circuit structures, may be embedded into mold material to provide a chip embedding package, e.g. an embedded wafer level package (eWLB or eWLP), e.g. a fan-out wafer level package (FOWLP), and the like. In semiconductor processing, wafer level packaging (WLP) may be used for packaging an integrated circuit while the integrated circuit is still part of the wafer or while the integrated circuit is handled as a wafer. In contrast, individual integrated circuits (e.g. individual chips or dies) may be first singulated from the wafer and packaged subsequently in other packaging technologies, wherein the chips or dies may be packaged individually. Wafer level packaging or a wafer level package may be regarded as a chip-scale package (CSP), wherein the resulting package may be substantially of the same size as the die or chip. A wafer level package may include electrical contacts, e.g. solder lands, for electrically contacting the one or more electronic circuits embedded into the mold material of a wafer level package.

SUMMARY

According to various embodiments, a package arrangement may include: a first encapsulation material; at least one electronic circuit at least partially embedded in the first encapsulation material, the at least one electronic circuit including a first contact pad structure at a first side of the at least one electronic circuit; at least one microelectromechanical system disposed over the first side of the at least one electronic circuit, the at least one microelectromechanical system including a second contact pad structure facing the first side of the at least one electronic circuit; a redistribution layer structure between the at least one microelectromechanical system and the at least one electronic circuit, the redistribution layer structure electrically connecting the first contact pad structure with the second contact pad structure, wherein a gap is provided between the at least one microelectromechanical system and the redistribution layer structure; a second encapsulation material at least partially covering the at least one microelectromechanical system, wherein the gap is free of the second encapsulation material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 7A-7E show a package arrangement in a schematic cross sectional view or side view at various processing stages during manufacture according to various embodiments;

FIGS. 8A-8E show a package arrangement in a schematic cross sectional view or side view at various processing stages during manufacture according to various embodiments;

FIGS. 10A-10C show a package in a schematic cross sectional view or side view at various processing stages during manufacture according to various embodiments;

DESCRIPTION

Figure 1:
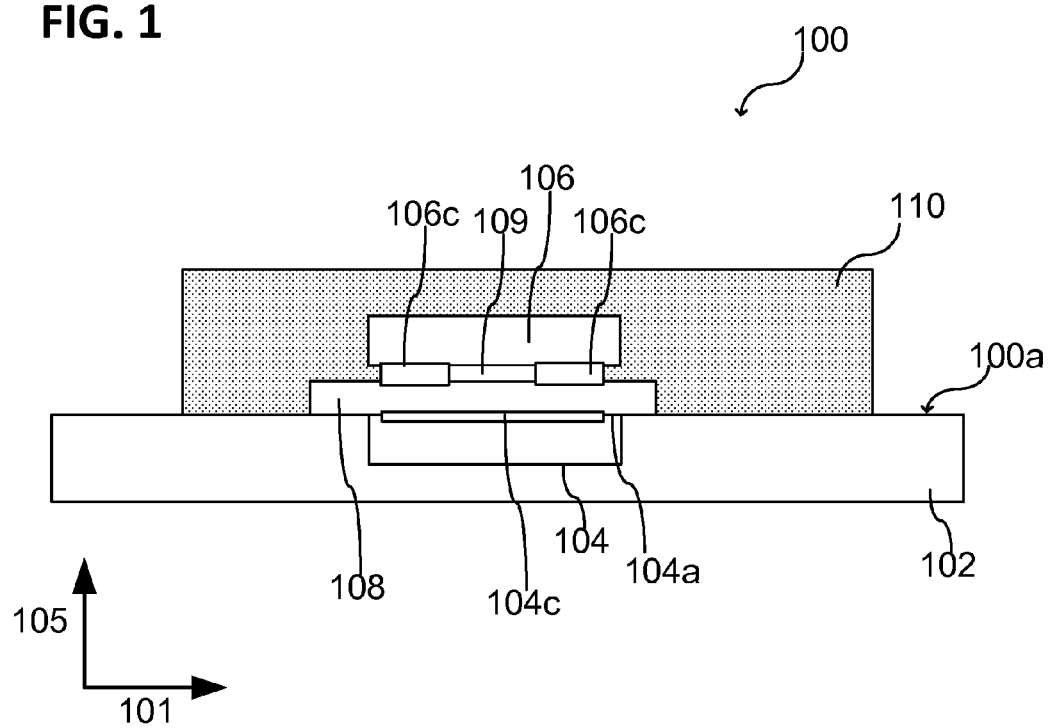
FIG. 1 shows a package arrangement in a schematic cross sectional view or side view according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a structure element) provided at least one of on or in a carrier (e.g. a substrate, a wafer, or a semiconductor work piece) or "laterally" next to, may be used herein to mean an extension or a positional relationship along a surface of the carrier. That means that a surface of a carrier (e.g. a surface of a substrate, a surface of a wafer, or a surface of a work piece) may serve as reference, commonly referred to as the main processing surface. Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier). The term "thickness" used with regards to a "thickness" of a layer may be used herein to mean the spatial extension of the layer perpendicular to the surface of the support (the material or material structure) on which the layer is deposited. If a surface of the support is parallel to the surface of the carrier (e.g. parallel to the main processing surface) the "thickness" of the layer deposited on the surface of the support may be the same as the height of the layer. Further, a "vertical" structure may be referred to as a structure extending in a direction perpendicular to the lateral direction (e.g. perpendicular to the main processing surface of a carrier) and a "vertical" extension may be referred to as an extension along a direction perpendicular to the lateral direction (e.g. an extension perpendicular to the main processing surface of a carrier).

Wafer level packaging may include extending the wafer fab processes to include device interconnection processes and/or device protection processes. For example, wafer level packaging may include embedding or partially embedding electronic circuits or integrated circuits (e.g. chips or dies) into mold material, and forming solder bumps or other contact structures in the mold material and/or over the embedded electronic circuits or integrated circuits. The embedded electronic circuits or integrated circuits may provide a wafer level package, e.g. a so called recon wafer (reconfigured wafer), recon carrier, or artificial wafer, which may be handled similarly to a wafer during the further processing.

According to various embodiments, a wafer level package (or in other words a package) may be formed by encapsulating one or more dies, one or more chips, and/or one or more electronic circuits (or any other electronic circuit structure) into an encapsulation material, e.g. by performing a molding process, as for example, wafer level compression molding. The dies, chips, or electronic circuits may be completely or partially encapsulated; and, optionally, the package including the embedded dies, chips, or electronic circuits may be thinned to a desired thickness, e.g. by grinding. Further, thinning the package may result in exposing at least some of the embedded dies, chips, or electronic circuits partially at a surface of the package. The recon wafer provided by the embedded dies, chips or electronic circuits may be singulated to provide individual packages or modules, e.g. by sawing, or other singulation processes.

According to various embodiments, an encapsulation material for manufacture of a package or wafer level package may include liquid molding compounds or solid molding compounds. According to various embodiments, an encapsulation material for manufacture of a package or a wafer level package may include a polymer, e.g. a resin, e.g. epoxy resin.

According to various embodiments, an encapsulation material for encapsulating (molding or casting) a chip, a die, and/or an electronic circuit may include liquid molding compounds or solid molding compounds. According to various embodiments, an encapsulation material for encapsulating (molding or casting) a chip, a die, and/or an electronic circuit may include a polymer, e.g. a resin, e.g. epoxy resin. According to various embodiments, any other suitable material may be used as encapsulation material, e.g. silicone, e.g. benzocyclobutene.

According to various embodiments, an electromechanical device may include a mechanical component, e.g. a sensor, or a movable component, and an electronic component, e.g. an electronic circuit structure or an integrated circuit structure. The term microelectromechanical system (MEMS) may be used herein to mean a small device or small devices, e.g. including electrical and mechanical components with a size less than about 100 μm. An electromechanical device may also include a nano-scale nanoelectromechanical system (NEMS) and nanotechnology. MEMS may be also referred to as micromachines or micro systems technology (MST). An electromechanical device may be manufactured in semiconductor processing technology, e.g. by applying the basic semiconductor processing techniques, as for example layering, patterning (e.g. by photolithography and etching), thermal processing, and/or ion implantation to provide the required shapes (mechanical components) and electronic structures.

According to various embodiments, a surface acoustic wave device may be an electromechanical device which may rely on a surface acoustic wave (SAW). A surface acoustic wave may travel along a surface of an elastic material with an amplitude that may decay exponentially with depth into the elastic material.

According to various embodiments, a surface acoustic wave device (e.g. a surface acoustic wave chip) may include a surface acoustic wave filter used for example in radio frequency applications. A surface acoustic wave device may be configured to convert electrical signals into a mechanical wave (into a SAW), e.g. by use of a piezoelectric crystal or ceramic, wherein the mechanical wave may be modified in the device, e.g. the mechanical wave may be delayed as it propagates across the device, before the mechanical wave may be converted back to an electrical signal, e.g. by further electrodes. Further, the delayed outputs may be recombined to provide a direct analog implementation of a finite impulse response filter. SAW filters may work for example up to a frequency of about 3 GHz for electronic signals. Further, a surface acoustic wave device may include a surface acoustic wave sensor, which may operate based on a modulation of surface acoustic waves to sense a physical quantity.

According to various embodiments, an electromechanical device (e.g. a MEMS, e.g. a SAW device) may be included into a package arrangement (e.g. into a wafer level package arrangement), or into any other multichip module including the electromechanical device and at least one electronic device coupled to the electromechanical device. According to various embodiments, a package arrangement may include at least one electromechanical device, wherein at least a part of the surface of the electromechanical device may not be covered with a solid material to allow the operation of the mechanical part of the electromechanical device, e.g. to allow an oscillation or a propagation of a surface acoustic wave, or any other movement of the electromechanical device. A surface acoustic wave chip may be part of a multichip module (e.g. of a package arrangement or wafer level package arrangement), wherein the surface acoustic wave chip may have a cavity (empty space) above those regions of the chip, where the acoustic wave has to be generated on the surface of the chip.

According to various embodiments, a method is provided to 3D-integrate at least one electromechanical chip into a wafer level package (e.g. as a chip stack) and to provide a cavity so that the electromechanical chip can be operated as desired. According to various embodiments, a method is provided to 3D-integrate a surface acoustic wave chip (or a plurality of surface acoustic wave chips) into a wafer level package (eWLP) and to build easily a cavity over a surface of the surface acoustic wave chip.

Typically, SAW chips may be bonded on ceramic substrates and covered by lids or foils which may form the cavity. Typically, already packaged SAW chips may be used to build a module including one or more SAW chips, wherein the packaged SAW chip may have a cavity already provided inside the package of the SAW chip. These packages may be bonded typically side-by-side to other chips. This typically used side-by-side arrangement may induce bigger packages and therefore higher costs. Further, using already packaged SAW chips may be expensive compared to providing a multichip wafer level package including one or more SAW chips and one or more other chips.

According to various embodiments, a method may be provided which may include using unpackaged SAW chips including flip-chip bumps and stack/solder them onto a redistribution layer of a wafer level package. The unpackaged SAW chips being used may be covered with a foil to prevent mold compound flowing into the gap between the wafer level package and the SAW chip, and, subsequently, an over-molding process may be applied to mold the SAW chip and the wafer level package at least partially. Alternatively, an SU8-frame may be used to prevent mold compound from flowing into the gap.

According to various embodiments, the small line/space for example needed for building inductors (e.g. coils) for the module can be done in the wafer level package (eWLP). Further, an electromagnetic induction (EMI) housing may be provided in and/or on the wafer level package for the chips embedded in the wafer level package, e.g. for LNA chips. For example, an EMI protection may be unnecessary for a SAW chip and therefore the EMI protection can be designed space saving, or illustratively only where it is needed.

According to various embodiments, the wafer level package may act as or may be a substrate for applying a commercial SAW chip (a SAW chip with flip-chip bumps without a cavity) which may be easy to be done and which may be cost effective, e.g. since a bigger line/space can be used.

According to various embodiments, the cavity needed for the SAW chip may be provided without harming the other components in the module, because they are already covered (embedded) in the wafer level package (in other words in the eWLP substrate).

According to various embodiments, the package arrangement (or in other words the embedded wafer level package arrangement) provided herein may be a multi-chip wafer level package (or in other words a multi-chip embedded wafer level package arrangement) with at least one electromechanical device (e.g. with at least one electromechanical chip). According to various embodiments, the package arrangement provided herein may include an electromechanical device (e.g. a SAW chip) stacked over an electronic device (e.g. over an electronic circuit, a chip, a passive device, or the like).

According to various embodiments, due to the 3D-attempt the module (or in other words the package arrangement) may be smaller and more cost effective than for example 2D-modules (including for example a side-by-side arrangement of the chips).

According to various embodiments, an electronic circuit, e.g. a low noise amplifier (LNA) or an LNA chip, or an integrated passive device (IPD) or IPD chip, or inductors in eWLP technology (in other words one or more electronic circuits or one or more chips using a multilayer RDL (redistribution layer) capability of the eWLP) may be used as substrate for one or more SAW chips (e.g. SAW chips with flip-chip bumps), wherein the needed functionalities (e.g. shielding, line/space, multilayer RDL, interface and connection of different chips) may be decoupled and limited to where they are needed.

FIG. 1 illustrates a package arrangement 100 (in other words a module or a package) in a schematic cross sectional view according to various embodiments, wherein the package arrangement 100 may include: a first encapsulation material 102 and an electronic circuit 104 at least partially embedded in the first encapsulation material 102, wherein the electronic circuit 104 may include a first contact pad structure 104c at a first side 104a of the electronic circuit 104. Further, the package arrangement 100 may include a plurality of electronic circuits 104 at least partially embedded in the first encapsulation material 102. Further, the first encapsulation material 102 may include a resin, e.g. epoxy, or any other encapsulation material being suitable for encapsulating the electronic circuit 104.

The electronic circuit 104 may include a chip, a die, or any other electronic circuit 104 in semiconductor technology. The electronic circuit 104 may include a passive device, e.g. a passive integrated device, as for example an inductor or a coil. According to various embodiments, the electronic circuit 104 may include or may be a driver circuit for at least one electromechanical device, e.g. a driver circuit for a SAW device or a SAW chip. The electronic circuit 104 may include at least one of a low noise amplifier (LNA), an integrated passive device (IPD), an inductor, and a resonator circuit.

According to various embodiments, the one or more electronic circuits 104 embedded into the first encapsulation material 102 may provide a carrier 100a, e.g. a so called recon carrier, a so called wafer level package or eWLP, for at least one electromechanical device 106. The first contact pad structure 104c may be provided at the first surface 104a of the electronic circuit 104 and the electronic circuit 104 may be at least partially embedded into the first encapsulation material 102. According to various embodiments, the first contact pad structure 104c may include a plurality of contact pads, the contact pads may be planarized or may protrude from the respective electronic circuit 104. The at least one electronic circuit 104 may be embedded into the first encapsulation material 102 so that the surface 104a of the electronic circuit 104 may be in-plane with a first side (e.g. the front side) of the carrier 100a.

As illustrated in FIG. 1, the package arrangement 100 may include an electromechanical device 106 (e.g. a MEMS, a NEMS, a SAW device or a SAW chip) disposed over the first side of the electronic circuit 104, wherein the electromechanical device 106 may include a second contact pad structure 106c facing the first side 104a of the electronic circuit 104. According to various embodiments, the second contact pad structure 106c may include a plurality of contact pads, the contact pads may be planarized or may protrude from the electromechanical device 106. Further, the package arrangement 100 may include a plurality of electromechanical devices 106.

According to various embodiments, the at least one electromechanical device 106 may be provided in flip-chip design so that the electromechanical device 106 may be electrically connected to the electronic circuit 104. The at least one electromechanical device 106 may include or may be an electronic filter, e.g. to modify a signal received from the at least one electronic circuit 104 and to provide a modified signal to the at least one electronic circuit 104.

According to various embodiments, the package arrangement 100 may further include a redistribution layer structure 108 disposed between the at least one electromechanical device 106 and the at least one electronic circuit 104, the redistribution layer structure 108 electrically connecting the first contact pad structure 104c with the second contact pad structure 106c. Illustratively, the redistribution layer structure 108 may include a wiring structure, e.g. metal lines, contact pads, vias, and the like, embedded into a dielectric material for electrically connecting the electronic circuit 104 with the electromechanical device 106 as desired.

As illustrated in FIG. 1, the electromechanical device 106 and the redistribution layer structure 108 may be configured so that a gap 109 is provided between the electromechanical device 106 and the redistribution layer structure 108. Illustratively, the electromechanical device 106 may be provided in flip-chip design so that the electromechanical device 106 may be electrically connected to the electronic circuit 104 via the redistribution layer structure 108, wherein the electromechanical device 106 and the redistribution layer structure 108 may be configured so that the gap 109 is provided when the electromechanical device 106 is mounted to the redistribution layer structure 108. According to various embodiments, the second contact pad structure 106c may protrude from the electromechanical device 106 to provide the gap 110.

Further, the package arrangement 100 may include a second encapsulation material 110 at least partially covering the electromechanical device 106, wherein the gap 109 is free of (or free from) the second encapsulation material 110. According to various embodiments, the first encapsulation material 102 and the second encapsulation material 110 may include or may consist of a resin, e.g. epoxy resin, or any other suitable molding material or encapsulation material used in semiconductor processing.

As illustrated in FIG. 1, the first contact pad structure 104c, e.g. including a plurality of first contact pads, may face the redistribution layer structure 108; or in other words, the first contact pad structure 104c may be electrically contacted by the redistribution layer structure 108. Further, the second contact pad structure 106c, e.g. including a plurality of second contact pads, may face the redistribution layer structure 108; or in other words, the second contact pad structure 106c may be electrically contacted by the redistribution layer structure 108.

The second encapsulation material 110 may cover a side (or surface) of the electromechanical device 106 facing away from the redistribution layer structure 108, e.g. a side opposite to the second contact pad structure 106c. Further, the second encapsulation material 110 may laterally surround the electromechanical device 106 covering the sides or surfaces of the electromechanical device 106 facing into the lateral direction 101; the lateral direction 101 may be defined by the surface of the carrier 100a. The second encapsulation material 110 may partially cover the redistribution layer structure 108.

According to various embodiments, the redistribution layer structure 108 may include a wiring structure for electrical routing, e.g. for electrically connecting the electronic circuit 104 and the electromechanical device 106, and a shielding structure for electromagnetic shielding, e.g. for EMI protection of the electronic circuit 104. The electromagnetic shielding may overlap more than 50% of the electronic circuit 104, with respect to the direction 105.

Various modifications and/or configurations of the package arrangement 100 and details referring to the electronic circuit 104, the electromechanical device 106, and the redistribution layer structure 108 are described in the following, wherein the features and/or functionalities described referring to FIG. 1 may be included analogously. Further, the features and/or functionalities described in the following may be included in the package arrangement 100 or may be combined with the package arrangement 100, as described before referring to FIG. 1.

Figure 2:
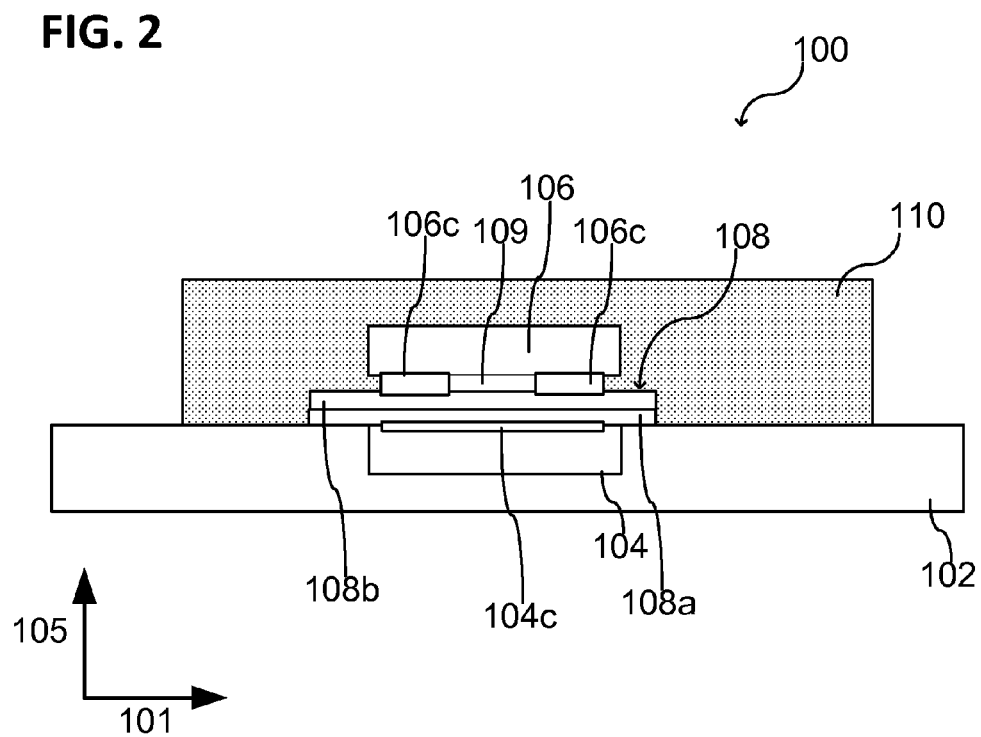
FIG. 2 shows a package arrangement in a schematic cross sectional view or side view according to various embodiments.

FIG. 2 illustrates a package arrangement 100 in a schematic cross sectional view according to various embodiments, wherein the redistribution layer structure 108 includes a first redistribution layer 108a and a second redistribution layer 108b, and wherein the second redistribution layer 108b may be disposed on the first redistribution layer 108a. Illustratively, the redistribution layer structure 108 is a multilevel redistribution 108. The first redistribution layer 108a may include a wiring structure with a plurality of metal lines, contact pads, and/or vias. The second redistribution layer 108b may include a wiring structure with a plurality of metal lines, contact pads, and/or vias. The second redistribution layer 108b may include, e.g. additional to the wiring structure, a metal layer for electromagnetic shielding (cf. FIG. 11).

Figure 3:
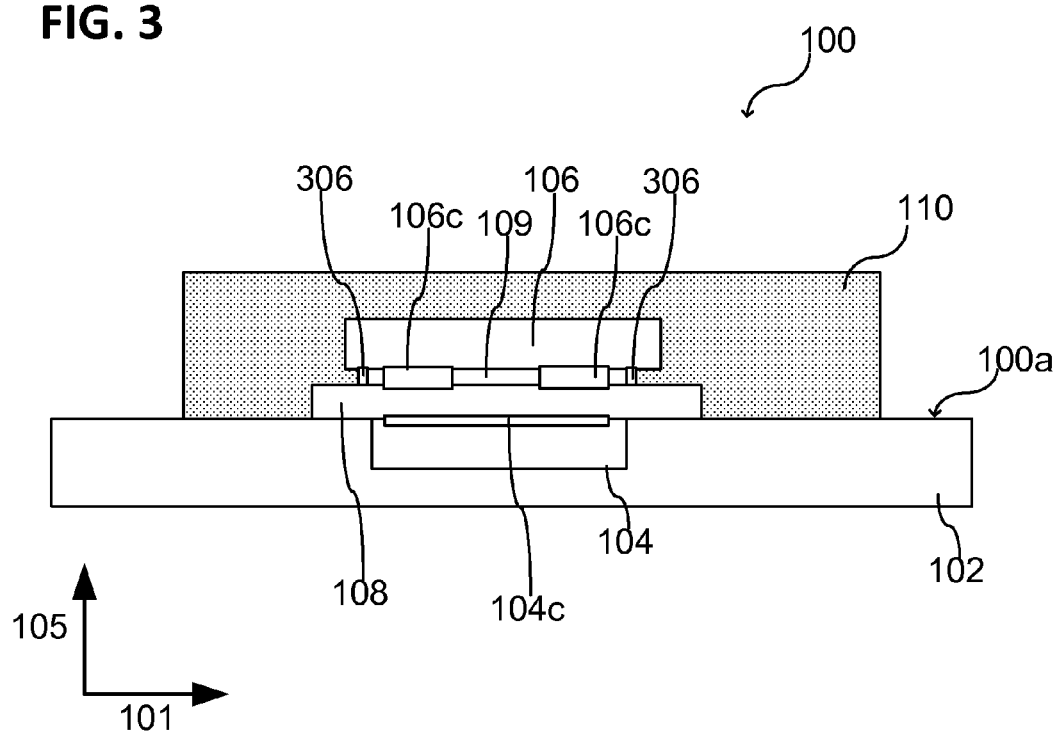
FIG. 3 shows a package arrangement in a schematic cross sectional view or side view according to various embodiments.

FIG. 3 illustrates a package arrangement 100 in a schematic cross sectional view according to various embodiments, wherein a sealing structure 306 may be disposed between the electromechanical device 106 and the redistribution layer structure 108, the sealing structure 306 surrounding (or in other words defining or encircling) the gap 109. Illustratively, the sealing structure 306 may prevent that the second encapsulation material 110 fills the gap 109 during processing, e.g. during encapsulating, casting, or molding. Alternatively or optionally, the electromechanical device 106 may be covered by a foil or tape before encapsulating (e.g. molding) the electromechanical device 106 so that the second encapsulation material 110 may not fill the gap 109 during processing.

Figure 4:
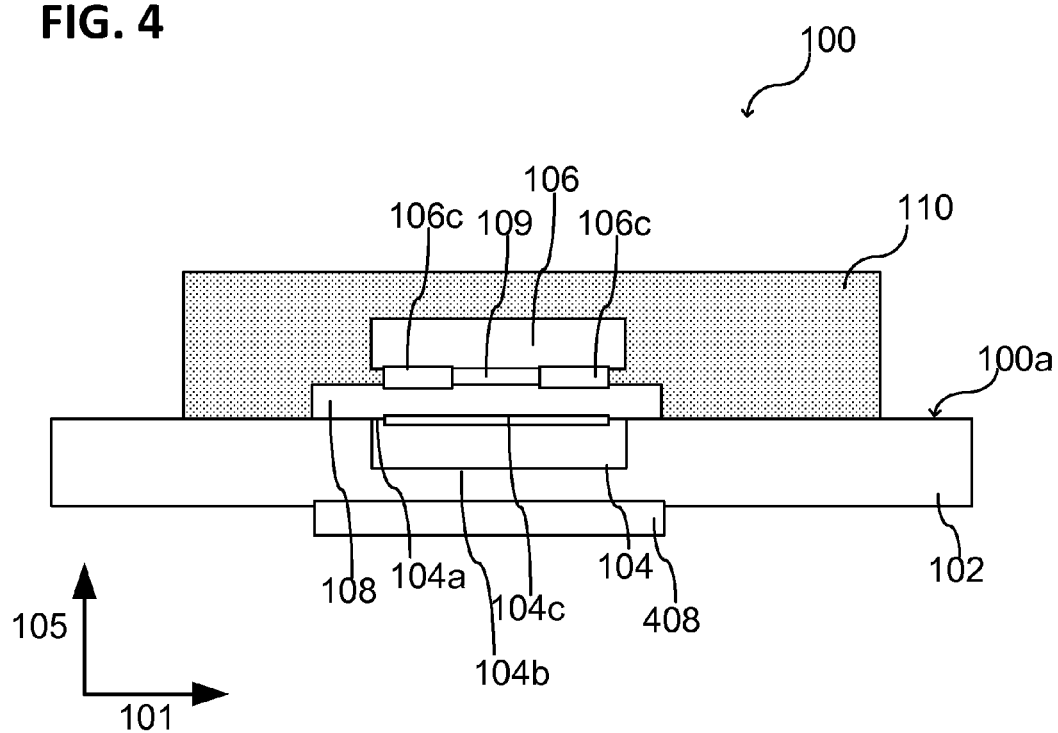
FIG. 4 shows a package arrangement in a schematic cross sectional view or side view according to various embodiments.

FIG. 4 illustrates a package arrangement 100 in a schematic cross sectional view according to various embodiments, wherein a further redistribution layer structure 408 is disposed over a second side 104b of the electronic circuit 104 opposite the first side 104a of the electronic circuit 104. In other words, the further redistribution layer structure 408 may be disposed over a second side (e.g. a backside) of the carrier 100a facing away from the redistribution layer structure 108 and the electromechanical device 106. According to various embodiments, the further redistribution layer structure 408 may be electrically connected to the electromechanical device 106, the electronic circuit 104, and/or the redistribution layer structure 108. According to various embodiments, the further redistribution layer structure 408 may electrically contact the backside 104b of the electronic circuit 104, e.g. in case the electronic circuit 104 is an electronically vertical device with a current flow from the first side 104a of the electronic circuit 104 to the second side 104b of the electronic circuit 104.

Figure 5A:
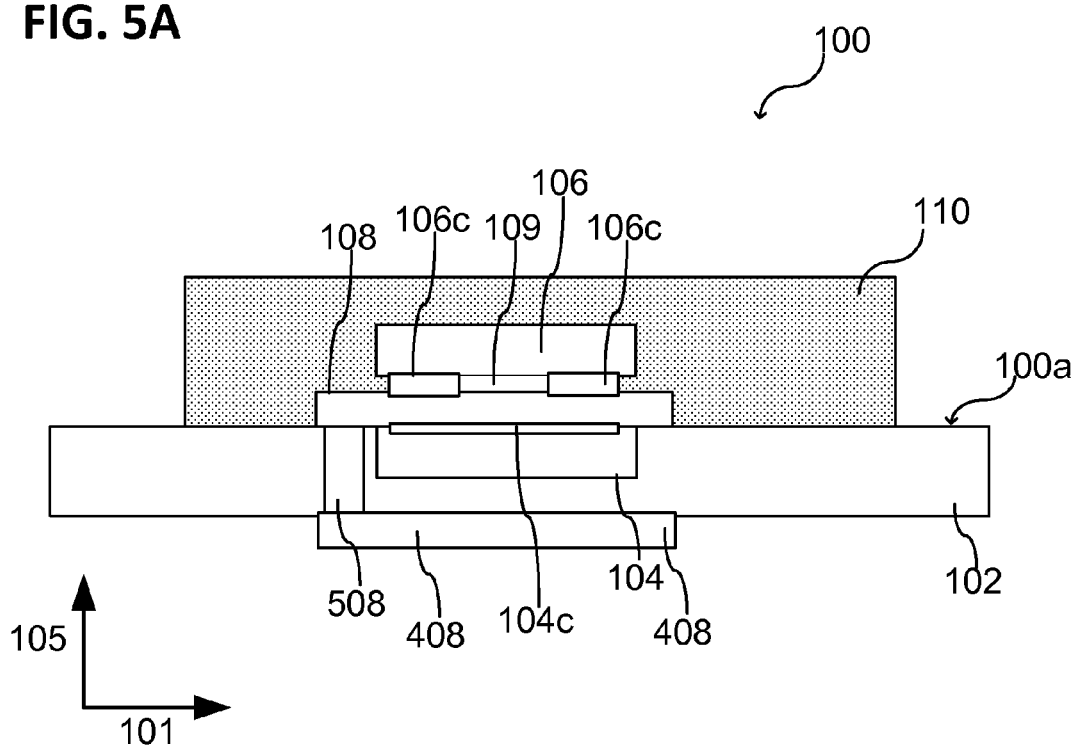
FIGS. 5A and 5B show a package arrangement respectively in a schematic cross sectional view or side view according to various embodiments.

As illustrated in FIG. 5A, according to various embodiments, the package arrangement 100 may include a via 508 extending through the first encapsulation material 102 (in other words extending through the carrier 100a from the front side of the carrier 100a to the backside of the carrier 100a), wherein the further redistribution layer structure 408 and the redistribution layer structure 108 may be electrically connected with each other by the via 508.

According to various embodiments, the redistribution layer structure 108 and the further redistribution layer structure 408 may be provided or may be formed in aluminum technology or in copper technology. Further, the via 508 may be provided or may be formed in aluminum technology or in copper technology. According to various embodiments, the via 508 may be formed after the electronic circuit 104 has been embedded into the first encapsulation material 102, e.g. by forming a through hole into the first encapsulation material 102 and by filling the through hole with an electrically conductive material, e.g. with a metal or metal alloy.

Alternatively, the package arrangement 100 may include a metal block 508 (a solid metal piece) at least partially embedded into the first encapsulation material 102 and disposed next to the electronic circuit 104, wherein the further redistribution layer structure 408 and the redistribution layer structure 108 are electrically connected with each other by the metal block 508. The metal block 508 may be embedded into the first encapsulation material 102 at the same time (together with) the at least one electronic circuit 104.

Figure 5B:
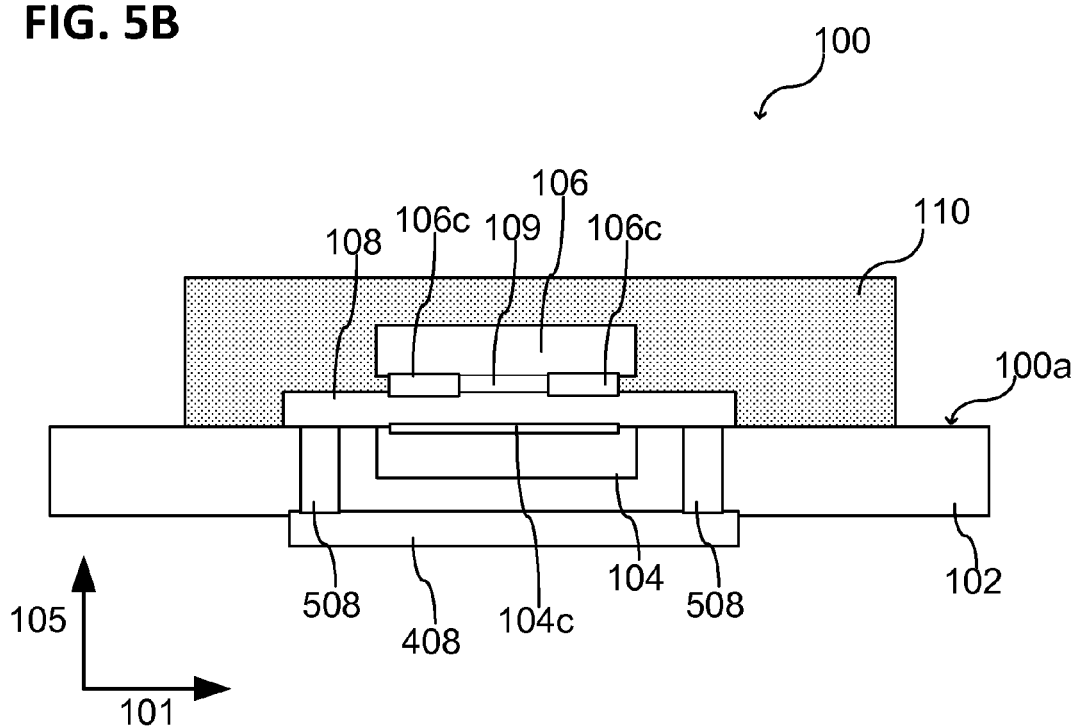

As illustrated in FIG. 5B, according to various embodiments, the package arrangement 100 may include a plurality of vias 508 or a plurality of metal blocks 508, in analogy as already described. Further, according to various embodiments, the first encapsulation material 102 and the second encapsulation material 110 may be electrically insulating or may include an electrically insulating (a dielectric) material. The redistribution layer structure 108 may provide a fan-out region laterally next to the electronic circuit 104 for electrically connecting the further redistribution layer structure 408 with the redistribution layer structure 108 through the carrier 100a.

Figure 6:
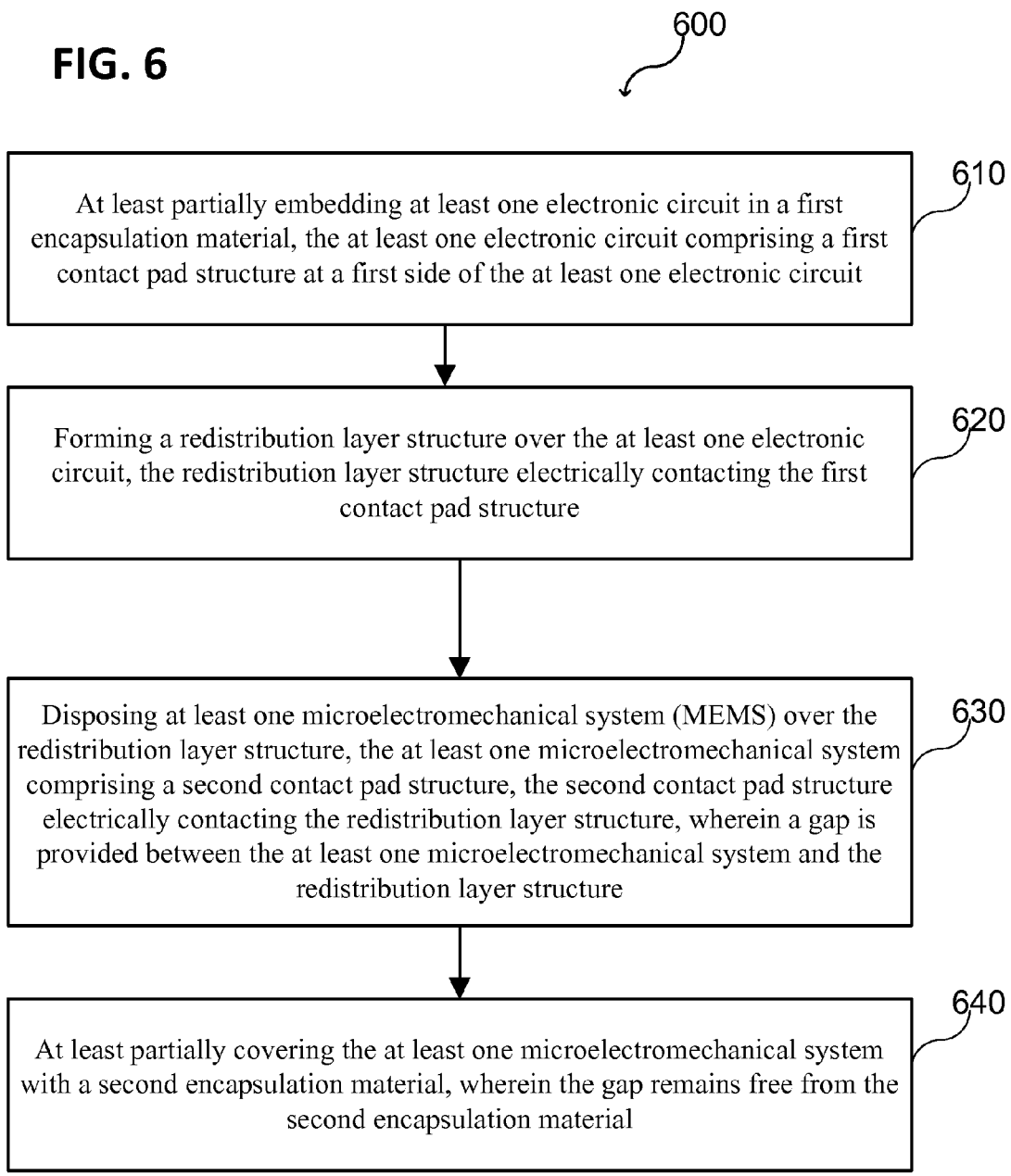
FIG. 6 shows a schematic flow diagram of a method of manufacturing a package arrangement according to various embodiments.

FIG. 6 illustrates a schematic flow diagram of a method 600 of manufacturing a package arrangement 100, according to various embodiments, wherein the method 600 may include: in 610, at least partially embedding at least one electronic circuit 104 in a first encapsulation material 102, the at least one electronic circuit 104 including a first contact pad structure 104c at a first side 104a of the at least one electronic circuit 104; in 620, forming a redistribution layer structure 108 over the at least one electronic circuit 104, the redistribution layer structure 108 electrically contacting the first contact pad structure 104c; in 630, disposing at least one electromechanical device 106 over the redistribution layer structure 108, the at least one electromechanical device 106 including a second contact pad structure 106c, the second contact pad structure 106c electrically contacting the redistribution layer structure 108, wherein a gap 109 is provided between the at least one electromechanical device 106 and the redistribution layer structure 108; and, in 640, at least partially covering the at least one electromechanical device 106 with a second encapsulation material 110, wherein the gap 109 remains free of the second encapsulation material 110. The method 600 may be performed for example as already described with reference to FIGS. 1, 2, 3, 4, 5A and 5B or as described in the following.

FIG. 7A illustrates a package arrangement 100 in a schematic cross sectional view at various processing stages during manufacture, according to various embodiments, e.g. during method 600 is carried out. At a processing stage 700a, a recon wafer 100a (in other words a wafer level package 100a or a carrier 100a) may be formed or provided. Therefore, a plurality of dies 104 (or chips 104 or electronic circuits 104) may be attached to an auxiliary carrier 702, the auxiliary carrier 702 including for example an adhesive (e.g. a dicing tape). The dies 104 (or the chips 104, or the electronic circuits 104) may be mounted on the auxiliary carrier 702 so that the first contact pad structure 104c of the respective die is facing the auxiliary carrier 702. Subsequently, the dies 104 may be encapsulated (covered) with the first encapsulation material 102. The auxiliary carrier 702 may be removed to provide the recon wafer 100a including the first encapsulation material 102 and the dies 104 at least partially embedded into the first encapsulation material 102.

At a further processing stage 700b in FIG. 7B, a redistribution 108 (in other words a redistribution layer structure 108) may be formed over the recon wafer 100a. The redistribution 108 may include a first redistribution layer 108a contacting each of the first contact pad structures 104c of the dies 104, and the redistribution 108 may include a second redistribution layer 108b for contacting the second contact pad structures 106c of electromechanical devices 106 to be mounted on the redistribution 108 (cf. FIG. 11). Illustratively, the redistribution 108 may include land pads on top for SAW chip assembly.

At a further processing stage 700c in FIG. 7C, a plurality of electromechanical devices 106 (e.g. a plurality of SAW chips 106) may be applied on the top metal (in other words on the redistribution layer structure 108). The second contact pad structures 106c of the electromechanical devices 106 (e.g. of the SAW chips 106) facing the redistribution 108, and the second redistribution layer 108b may electrically contact the second contact pad structures 106c of the electromechanical devices 106 (cf. FIG. 11). The electromechanical devices 106 may be applied to the second redistribution layer 108b by soldering. According to various embodiments, each electromechanical device 106 may be applied with an SU8-ring 306 disposed between the electromechanical device 106 and the redistribution 108, as already described.

At a further processing stage 700d in FIG. 7D, the electromechanical devices 106 (e.g. the SAW chips 106) may be over-molded with the second encapsulation material 110 (or in other words with mold material 110). Overmolding the electromechanical devices 106 may include applying a mold sheet 710s over the electromechanical devices 106 and performing a compression molding subsequently to get the final thickness. The gap 109 may be free of the molding material after the over-molding. Illustratively, the gap may be free of solid material, or in other words, the gap 109 may be an empty space.

At a further processing stage 700e in FIG. 7E, the recon wafer 100a (the mold stack) may be ground (thinned to a desired final thickness) and a footprint 708 may be generated at the bottom side of the thinned recon wafer 100a by the further redistribution layer structure 408 formed at the bottom side of the thinned recon wafer 100a. The vias 508 may be formed through the thinned recon wafer 100a from the backside. According to various embodiments, recon wafer 100a, e.g. the dies 104 and/or the first encapsulation material 102, may be thinned (ground) to a thickness of less than about 100 µm. According to various embodiments, the recon wafer 100a, the electronic circuits 104, the electromechanical devices 106, the redistribution 108, and the second encapsulation material 110 may be provide a package arrangement 100 or may be singulated to provide a plurality of package arrangements 100.

According to various embodiments, the package arrangement 100 (or in other words the module 100 or the multi-chip eWLP 100) may be used for GPS-applications or other radio frequency (RF) applications, e.g. as electronic filter, e.g. as SAW filter. Further, the package arrangement 100 may be used for applications including a moveable component, e.g. a membrane, a gyroscopic device.

According to various embodiments, the gap 109 below the electromechanical device 106 (e.g. below the SAW chip 106) may have a thickness (e.g. a collapsed thickness) in the range from about 10 μm to about 50 μm, e.g. in the range from about 20 μm to about 35 μm, e.g. in the range from about 25 μm to about 30 μm. Further, the gap 109 may have a width (a lateral extension) greater than 100 μm, e.g. greater than 200 μm, e.g. greater than 300 μm, e.g. greater than 400 μm, e.g. greater than 500 μm. According to various embodiments, the gap 109 (or the empty space) may have a volume in the range from about 0.005 μm$^3$ to about 0.040 μm$^3$.

According to various embodiments, the electronic circuits 104 may include an RCL (or LRC) resonator circuit including for example a resistor, a capacitor, and an inductor (a coil).

FIG. 8A illustrates a package arrangement 100 in a schematic cross sectional view at various processing stages during manufacture, according to various embodiments, e.g. during method 600 is carried out. At a processing stage 800a, a recon wafer 100a may be formed or provided. Therefore, a plurality of dies 104 (or chips 104, or electronic circuits 104) may be attached to an auxiliary carrier 702, the auxiliary carrier 702 including for example an adhesive (e.g. a dicing tape). The dies 104 may be mounted (disposed) on the auxiliary carrier 702 so that the first contact pad structure 104c is facing the auxiliary carrier 702. Further, a plurality of metal blocks 508 may be mounted (disposed) on the auxiliary carrier 702 next to the dies 104. Subsequently, the dies 104 and the metal blocks 508 may be encapsulated (covered) with the first encapsulation material 102. The auxiliary carrier 702 may be removed to provide the recon wafer 100a including the first encapsulation material 102, the dies 104, and the metal blocks 508 at least partially embedded into the first encapsulation material 102. According to various embodiments, at the first processing stage 800a, a recon wafer 100a may be generated including silicon dies 104 and embedded solder lands 508; the recon wafer 100a may be also referred to a lead frame wafer.

At a further processing stage 800b in FIG. 8B, a redistribution 108 may be formed over the recon wafer 100a. The redistribution 108 may electrically connect the dies 104 to the embedded solder lands 508. The redistribution 108 may include a first redistribution layer 108a contacting each of the first contact pad structures 104c of the dies 104, and the redistribution 108 may include a second redistribution layer 108b for contacting the second contact pad structures 106c of the electromechanical devices 106 to be mounted on the redistribution 108 (cf. FIG. 11A-C). Illustratively, the redistribution 108 may include land pads on top for SAW chip assembly.

At a further processing stage 800c in FIG. 8C, a plurality of electromechanical devices 106 (e.g. a plurality of SAW chips 106) may be applied (mounted or disposed) on the top metal (in other words on the redistribution layer structure 108). The second contact pad structures 106c of the electromechanical devices 106 (e.g. of the SAW chips 106) facing the redistribution 108 respectively, and the second redistribution layer 108b may electrically contact the second contact pad structures 106c of the electromechanical devices 106 (cf. FIG. 11A-C). The electromechanical devices 106 may be applied by soldering or gluing.

According to various embodiments, each electromechanical device 106 may be applied with an SU8-ring 306 disposed between the electromechanical device 106 and the redistribution 108, as already described. The SU8-ring 306 may be optional, if a molding sheet is used for encapsulating the electromechanical devices 106.

At a further processing stage 800d in FIG. 8D, the electromechanical devices 106 (e.g. the SAW chips 106) may be over-molded with the second encapsulation material 110 (or in other words with mold material 110). Over-molding the electromechanical devices 106 may include applying a mold sheet 710s over the electromechanical devices 106 and performing a compression molding subsequently to get the final thickness. The gap 109 may be free of the molding material after the over-molding. Illustratively, the gap may be free of solid material, or in other words, the gap 109 may be an empty space.

At a further processing stage 800e in FIG. 8E, the recon wafer 100a (or in other words the mold stack 100) may be ground (thinned to a final thickness) and a footprint 808 may be generated at the bottom side of the thinned recon wafer 100a by the metal blocks 508 that are embedded in the recon wafer 100a. The metal blocks 508 may be partially removed and/or at least partially exposed at the backside of the thinned recon wafer 100a during the grinding.

According to various embodiments, the recon wafer 100a, e.g. the dies 104, the first encapsulation material 102, and/or the metal blocks 508, may be thinned to a thickness of less than about 100 μm. Further, the metal blocks 508 may be provided by a lead frame. The recon wafer 100a may be a lead frame wafer or a lead frame package (cf. FIGS. 12A to 12C). According to various embodiments, the recon wafer 100a, the electronic circuits 104, the electromechanical devices 106, the redistribution 108, and the second encapsulation material 110 may be provide a package arrangement 100 or may be singulated to provide a plurality of package arrangements 100.

According to various embodiments, the package arrangement 100 may be used for GPS-applications or other RF applications, e.g. as electronic filter, e.g. as SAW filter. Further, the package arrangement 100 may be used for applications including any other moveable component.

According to various embodiments, the electronic circuits 104 may include an RCL (or LRC) resonator circuit including for example a resistor, a capacitor, and an inductor (a coil). Illustratively, an electronic circuit 104 may support at least one electromechanical device 106 of the package arrangement 100, or in other words, the electronic circuit 104 may be a driver circuit or a driver device for at least one electromechanical device 106 of the package arrangement 100. Further, a plurality of electronic circuits 104 may be provided and configured to operate at least one electromechanical device 106.

According to various embodiments, at least some (or all) of the contact pads 104c of the first contact pad structure 104c may be routed to the backside of the recon wafer 100a. According to various embodiments, the metal blocks 508 or the vias 508 may electrically contact the electronic circuit 104 and the electromechanical device 106, e.g. by means of the redistribution layer structure 108.

Figure 9A:
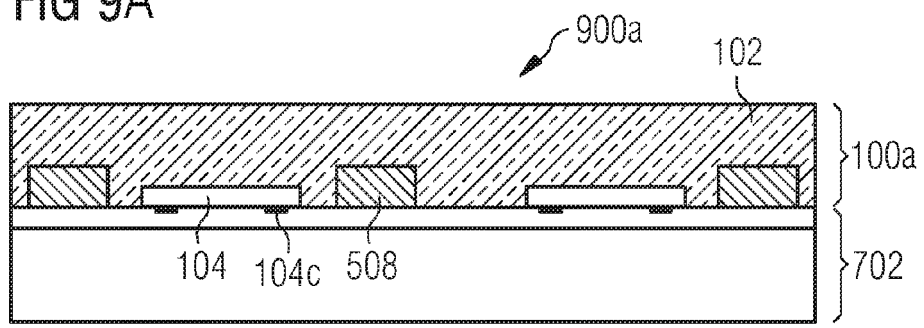
FIGS. 9A-9D show a package in a schematic cross sectional view or side view at various processing stages during manufacture according to various embodiments.

FIG. 9A shows a wafer level package or a part of a wafer level package in a schematic cross sectional view or side view at various processing stages during manufacture according to various embodiments. According to various embodiments, solder lands 508 may be provided in a chip embedding package 100a (e.g. in an embedded wafer level package, eWLP) which are reliable, may act as heat spreaders and may be less fragile against copper leaching into the solder joint.

Typically, solder lands in embedding packages may be created by pattern plating or pattern etching copper lands, wherein the typically formed copper lands may be relatively thin copper layers. According to various embodiments, massive blocks 508 may be embedded side by side to chips 104 and other components (e.g. SAW chips 106), wherein the massive blocks 508 may act as direct solder lands. According to various embodiments, the massive blocks 508 may have a lateral extension greater than about several tens of microns, e.g. a lateral extension in the range from about 10 μm to about 1 mm, or even greater than about 1 mm.

Solder lands created by pattern plating or pattern etching may be relatively thin metal layers which can be consumed by soldering (so called leaching) or electro migration. In contrast, according to various embodiments, the massive metal blocks 508 may be more robust and may last longer until fatigue. The massive metal blocks 508 may also change the overall CTE (coefficient of thermal expansion) of a package more into the direction of the PCB (printed circuit board) and therefore the massive metal blocks 508 may be positive in terms of board-level reliability. Further, the massive metal blocks 508 may act as heat spreader and lead to a good transfer of heat into the PCB (e.g. for the use in power packages). The massive metal blocks 508 may be, for example, directly soldered to the PCB (solder lands).

According to various embodiments, one or more massive metal blocks 508 may be embedded side by side (laterally next to each other) to the chips 104, dies 104, or electronic circuits 104, as illustrated for example in FIG. 5A, FIG. 8A-8E, FIG. 9A-9D and FIG. 10A-10C. These metal blocks 508 may act directly as solder lands. Further, the metal blocks 508 may be coated to have a wettable finish.

According to various embodiments, a method for manufacturing a carrier 100a (e.g. a recon wafer) may include: at least partially embedding at least one electronic circuit 104 (e.g. one or more dies or one or more chips) and at least one metal block 508 (e.g. laterally) next to the at least one electronic circuit 104 in a first encapsulation material 102, the at least one electronic circuit 104 including a first contact pad structure 104c at a first side 104a of the at least one electronic circuit 104; forming a redistribution layer structure 108 over the at least one electronic circuit 104, the redistribution layer structure 108 electrically contacting the first contact pad structure 104c and the at least one metal block 508.

Illustratively, a recon wafer 100a may be provided, the recon wafer 100a including one or more electronic circuits 104 and one or more metal blocks 508 next to the one or more electronic circuits 104. As illustrated in FIG. 9, a recon wafer 100a (in other words a wafer level package 100a) may be formed or provided at a processing stage 900a. Therefore, a plurality of dies 104 (or a plurality of chips or a plurality of electronic circuits 104) may be attached to an auxiliary carrier 702, the auxiliary carrier 702 including for example an adhesive (e.g. a dicing tape). The dies 104 (or the chips 104, or the electronic circuits 104) may be mounted (disposed) on the auxiliary carrier 702 so that the first contact pad structure 104c is facing the auxiliary carrier 702. Further, a plurality of metal blocks 508 may be mounted (disposed) on the auxiliary carrier 702 next to the dies 104. Subsequently, the dies 104 and the metal blocks 508 may be encapsulated (covered) with the first encapsulation material 102. The auxiliary carrier 702 may be removed providing the recon wafer 100a including the first encapsulation material 102, and the dies 104 and the metal blocks 508 at least partially embedded into the first encapsulation material 102. According to various embodiments, at the first processing stage 900a, a recon wafer 100a (also referred to as lead frame wafer) may be generated including silicon dies 104 and embedded solder lands 508.

Figure 9B:
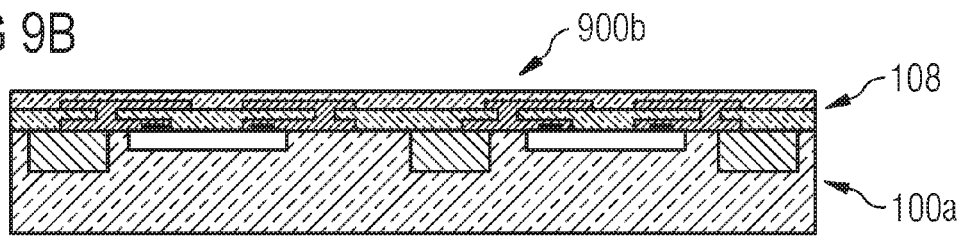

At a further processing stage 900b in FIG. 9B, a redistribution 108 (in other words a redistribution layer structure 108) may be formed over the recon wafer 100a. The redistribution 108 may electrically connect the dies 104 to the embedded solder lands 508. The redistribution 108 may include a first redistribution layer 108a contacting each of the first contact pad structures 104c of the dies 104, and the redistribution 108 may include a second redistribution layer 108b for contacting and/or mounting a further electronic device or electromechanical device on the redistribution 108 (cf. FIG. 11). Illustratively, the redistribution 108 may include land pads on top, e.g. for a multi-chip assembly.

Figure 9C:
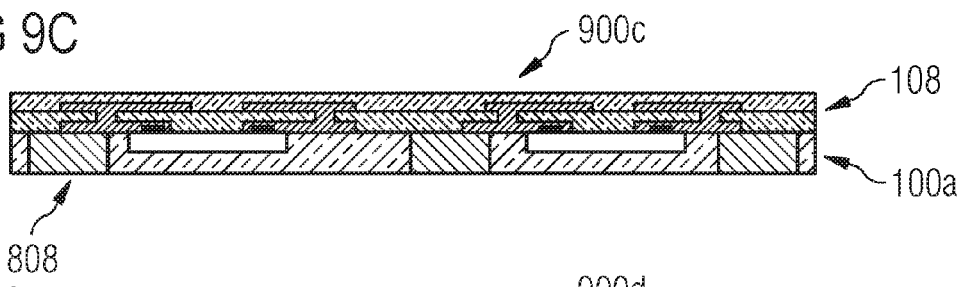

At a further processing stage 900c in FIG. 9C, the recon wafer 100a may be ground (thinned to a final thickness) to expose the embedded metal blocks 508 at the backside of the recon wafer 100a. The metal blocks 508 may be partially removed or at least partially exposed at the backside of the thinned recon wafer 100a by grinding. Illustratively, the first encapsulation material 102 of the recon wafer 100a may be partially removed to expose the embedded solder lands 508.

According to various embodiments, the recon wafer 100a, e.g. the dies 104, the first encapsulation material 102, and/or the metal blocks 508, may be thinned to a thickness of less than about 100 μm. Further, the metal blocks 508 may be provided by a lead frame. The recon wafer 100a may be a lead frame wafer or a lead frame package (cf. FIGS. 12A to 14C).

Figure 9D:
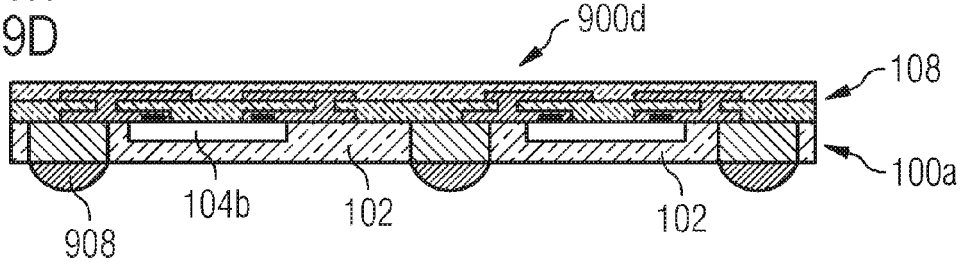

At a further processing stage 900d in FIG. 9D, a solder finish may be performed, e.g. by means of solder paste printing and/or reflow soldering. As illustrated in FIG. 9, the recon wafer 100a may include solder 908 at the metal blocks 508 exposed at the backside of the recon wafer 100a. According to various embodiments, the electronic circuits 104 (e.g. the dies 104 or the chips 104) may be electrically and/or thermally isolated at their backside 104b. In other words, the backside 104b of the dies 104 included in the recon wafer 100a may be covered with the first encapsulation material 102, as for example illustrated in FIG. 9A-9D.

Alternatively, as illustrated in FIG. 10A, the one or more dies 104 (e.g. the at least one electronic circuit 104) may include a pre-applied solder-backside 904. In other words, the backside 104b of the at least one die 104 may be covered with solder 904 or at least partially covered with solder 904, before the at least one die 104 is embedded into the first encapsulation material 102 or before the at least one die 104 is mounted on the auxiliary carrier 702.

Further, during grinding the recon wafer 100a, as already described before, e.g. at the further processing stage 900c, the metal blocks 508 and the solder 904 (in other words the pre-applied solder-backside 904) may be exposed at the backside of the thinned recon wafer 100a. Illustratively, the first encapsulation material 102 may be partially removed to expose the metal blocks 508 and the solder 904 at least partially. This may allow to electrically and/or thermally contact the backside 104b of the at least one die 104. According to various embodiments, the mold compound 102 may be ground from the back to expose the chip-solder-backside 904 and the embedded solder lands 508.

Figure 11A:
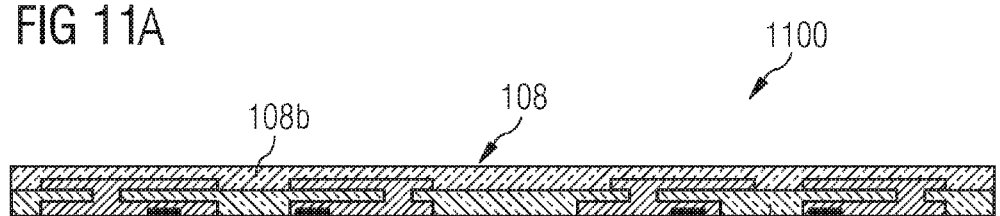
FIGS. 11A-11C show a redistribution layer structure of a package or of a package arrangement in a schematic view according to various embodiments.
Figure 11B:
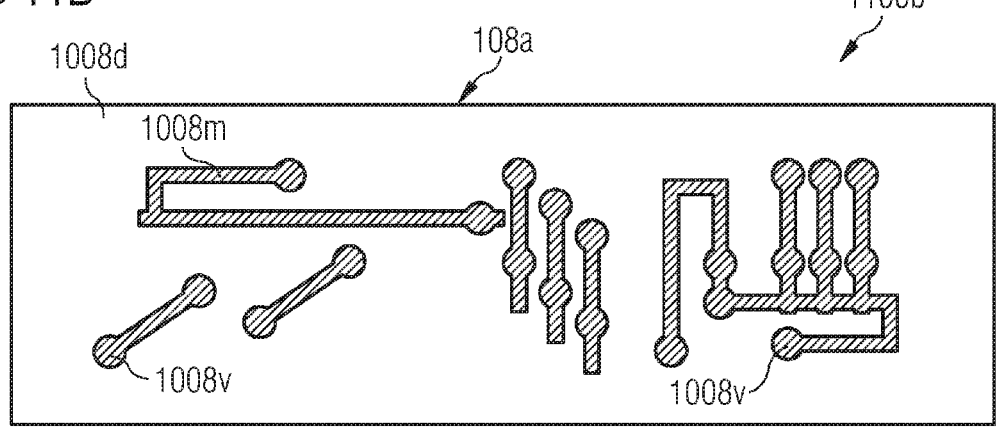

FIG. 11A illustrates the redistribution layer structure 108 of a wafer level package 100a, a recon wafer 100 or of a package arrangement 100, as described herein, in a schematic cross sectional view 1100 seen from a lateral direction and in two schematic top views 1100b, 1100t or cross sections 1100b, 1100t of the redistribution layer structure 108 seen from a vertical direction (perpendicular to the lateral direction) according to various embodiments. As already described, the redistribution layer structure 108 may include a first redistribution layer 108a and a second redistribution layer 108b over the first redistribution layer 108a. As illustrated in FIG. 11B in a top view 1100b, the first redistribution layer 108a may include a plurality of vias 1008v and a plurality of metal lines (a wiring structure) 1008m extending within a dielectric material 1008d. The first redistribution layer 108a may serve for re-routing the first contact pad structure 104c of the at least one electronic circuit 104.

Figure 11C:
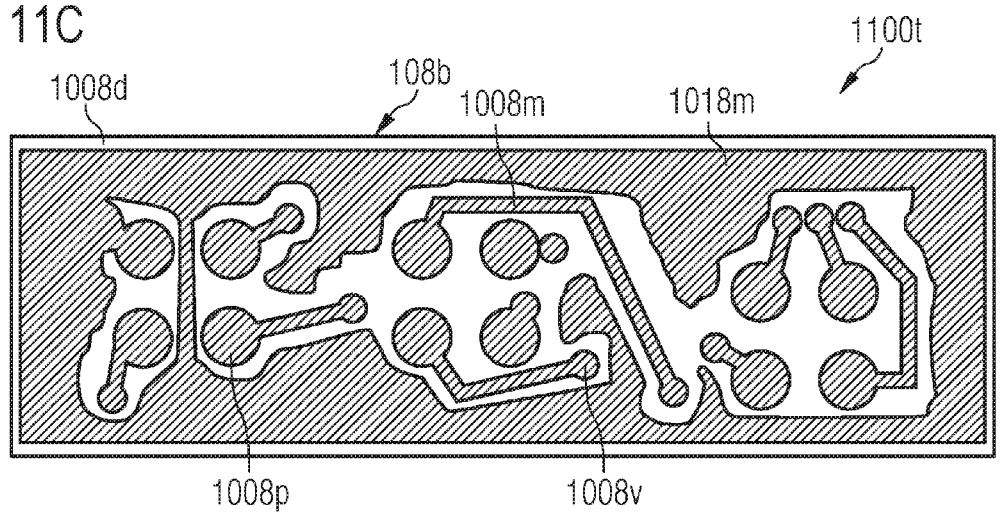

As further illustrated in FIG. 11C in the top view 1100t, the second redistribution layer 108b may include a plurality of vias 1008v and a plurality of metal lines 1008m extending within a dielectric material 1008d. The second redistribution layer 108a may serve for re-routing between the first redistribution layer 108a and a further electronic device or electromechanical device 106 to be applied over the second redistribution layer 108b. According to various embodiments, the second redistribution layer 108b may further include a metal layer 1018m for electromagnetic shielding. In other words, the second redistribution layer 108b may include a shielding structure 1018m to provide an electromagnetic shielding for the at least one electronic circuit 104. Further, the metal layer 1018m for electromagnetic shielding may extend over more than half of the area of the redistribution layer structure 108.

The first redistribution layer 108a may include a fine pattering, e.g. with a smaller line/space than the second redistribution layer 108b. The first redistribution layer 108a may include, referring to the volume, less metal than the second redistribution layer 108b, since the second redistribution layer 108b may include the metal layer 1018m for electromagnetic shielding. This metal layer may be contacted to the ground. According to various embodiments, the metal layer 1018m for electromagnetic shielding may not be electrically connected to the first contact pads 104c of the at least one electronic circuit 104 and may not be electrically connected to the second contact pads 106c of the at least one electromechanical device 106 (cf. FIG. 7A-E and FIG. 8A-E). According to various embodiments, the metal layer 1018m for electromagnetic shielding may be electrically separated from the wiring structure of the redistribution layer structure 108 for re-routing. Further, the metal layer 1018 may include one or more metal and/or one or more metal alloys.

According to various embodiments, components (e.g. the at least one electromechanical device 106) disposed over the redistribution layer structure 108 may not need an electromagnetic shielding, wherein components (e.g. the at least one electronic circuit 104) disposed below the redistribution layer structure 108 may need an electromagnetic shielding. The first redistribution layer 108a may be configured for routing of the components (e.g. the at least one electronic circuit 104) which need the electromagnetic shielding. The second redistribution layer 108b may be configured for routing to components (e.g. to the at least one electromechanical device 106) which may not need the electromagnetic shielding, wherein the second redistribution layer 108b may include landing pads 1008p for those components which may not need the electromagnetic shielding. Further, the second redistribution layer 108b may include a large RDL area 1018m which acts as electromagnetic shielding for the underlying components which may need the electromagnetic shielding.

FIGS. 12A to 14C show various methods of metal embedding and singulation, and a carrier 100a (e.g. also referred to as recon wafer or wafer level package) respectively in a top view and cross sectional views at various processing stages.

Figure 12A:
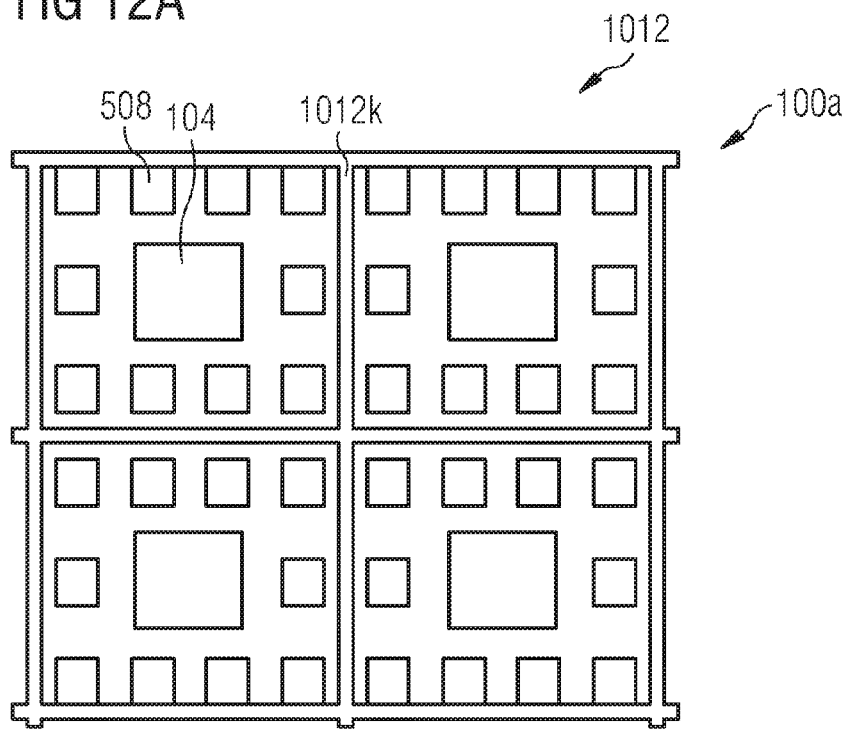
FIGS. 12A to 12D show a package arrangement respectively in a schematic cross sectional view or side view at various processing stages during manufacture according to various embodiments.

FIG. 12A illustrates a carrier 100a, as already described, wherein the carrier 100a is provided by the embedding of single metal parts 508, e.g. by embedding lead-frame pieces singulated prior to embedding, which acts as solder lands for one package 1000 respectively. The chips 104 (e.g. the electronic circuits 104) and the single metal parts 508 (e.g. the metal blocks 508) may be arranged in a x-y-pattern 1012, e.g. on the auxiliary carrier 702, before the chips 104 and the single metal parts 508 are embedded into the first encapsulation material 102. According to various embodiments, the x-y-pattern may define or may provide singulation streets 1012k for singulation of the carrier 100a into individual packages 1000.

The carrier 100a (e.g. the recon wafer as described before) may be singulated into a plurality of packages 1000 (or in analogy into a plurality of package arrangements 100 as described before). In other words, the carrier 100a may include a plurality of electronic circuits 104 and, optionally, a plurality of electromechanical devices 106, and a plurality of metal blocks 508 being at least partially embedded into the first encapsulation material 102 at a first processing stage 1012a.

Figure 12B:
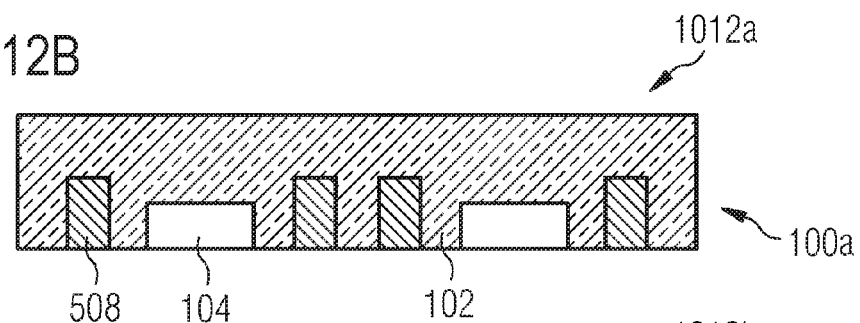
Figure 12C:
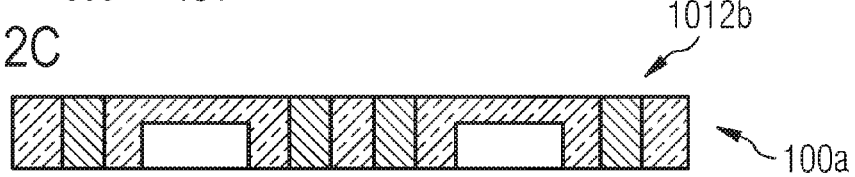
Figure 12D:
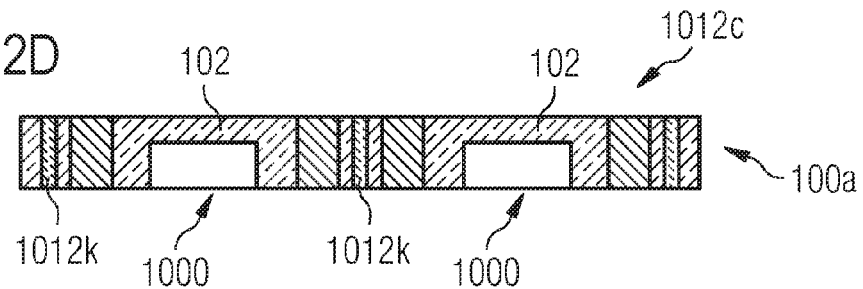

At the processing stage 1012a in FIG. 12B, the metal blocks 508 may be exposed at a front side of the carrier 100a. Further, as illustrated at a further processing stage 1012b in FIG. 12C, the carrier 100a may be ground from the backside of the carrier 100a to the desired thickness. Further, as illustrated at a further processing stage 1012c in FIG. 12D, the carrier 100a may be singulated into a plurality of packages 1000, e.g. along the singulation streets 1012k.

Figure 13A:
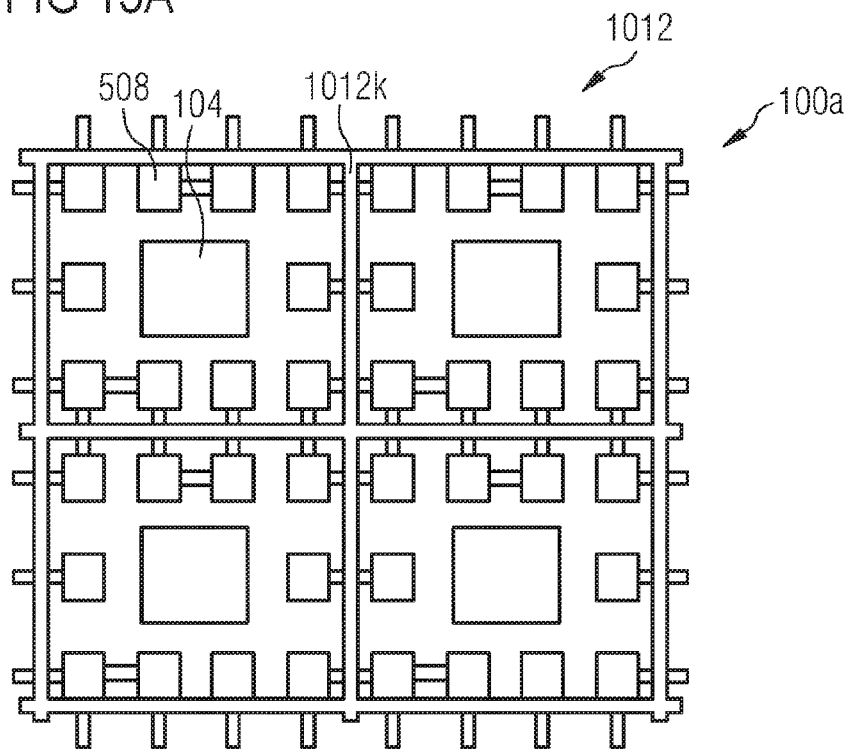
FIGS. 13A to 13D show a package arrangement respectively in a schematic cross sectional view or side view at various processing stages during manufacture according to various embodiments.

Alternatively, as for example illustrated in FIG. 13A, metal lead-frames or lead-frame-parts may be embedded into the first encapsulation material 102, wherein the metal lead-frames or lead-frame-parts are singulated after embedding (e.g. during package singulation) and act as solder lands 508 for different packages 1000.

According to various embodiments, the carrier 100a may be provided by the embedding of metal lead-frames or lead-frame-parts, wherein a metal lead-frame or a lead-frame-part may include two or more than two metal blocks 508 connected with each other prior to embedding. The chips 104 (e.g. the electronic circuits 104) and the at least partially connected metal blocks 508 may be arranged in a x-y-pattern 1012, e.g. on the auxiliary carrier 702, before the chips 104 and the at least partially connected metal blocks 508 are embedded into the first encapsulation material 102. According to various embodiments, the x-y-pattern 1012 may define or may provide singulation streets 1012k for singulation of the carrier 100a into individual packages 1000.

The carrier 100a (e.g. the recon wafer as described before) may be singulated into a plurality of packages 1000 (or in analogy into a plurality of package arrangements 100 as described before). In other words, the carrier 100a may include a plurality of electronic circuits 104 and, optionally, a plurality of electromechanical devices 106, and a plurality of metal blocks 508 being at least partially embedded into the first encapsulation material 102 at a first processing stage 1012*a*.

Figure 13B:
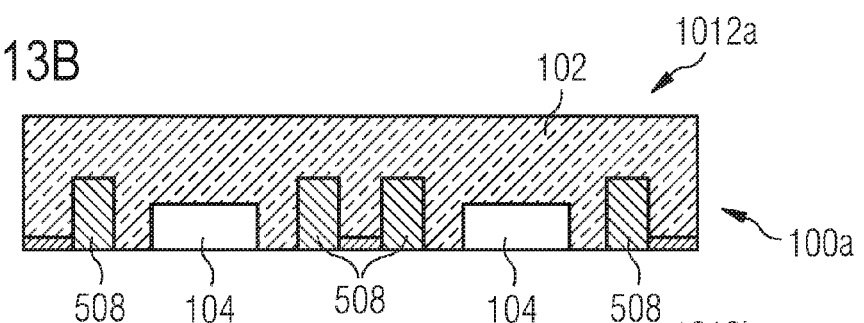
Figure 13C:
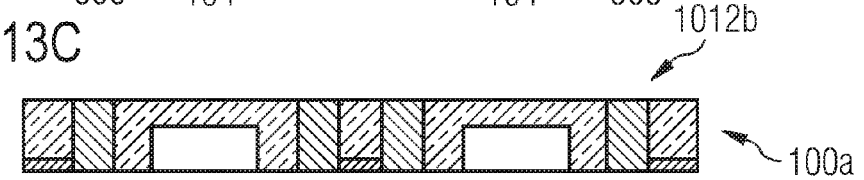
Figure 13D:
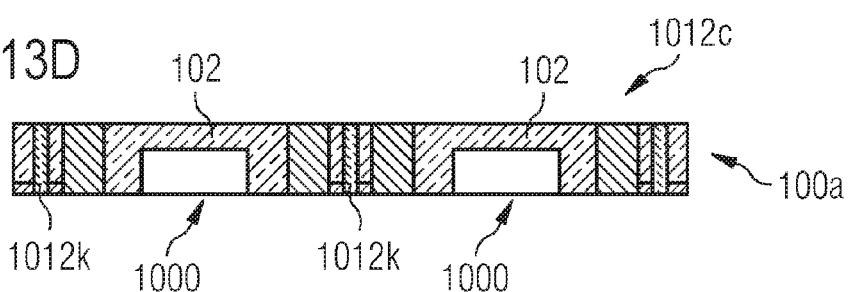

At the processing stage 1012*a* in FIG. 13B, the metal blocks 508 may be exposed at a front side of the carrier 100*a*. Further, as illustrated at a further processing stage 1012*b* in FIG. 13C, the carrier 100*a* may be ground from the backside of the carrier 100*a* to the desired thickness. Further, as illustrated at a further processing stage 1012*c* in FIG. 13D, the carrier 100*a* may be singulated into a plurality of packages 1000, e.g. along the singulation streets 1012*k*. During singulation, the metal lead-frames or lead-frame-parts may be singulated into individual metal blocks 508 being embedded into the first encapsulation material 102 of the respective package 1000.

Figure 14A:
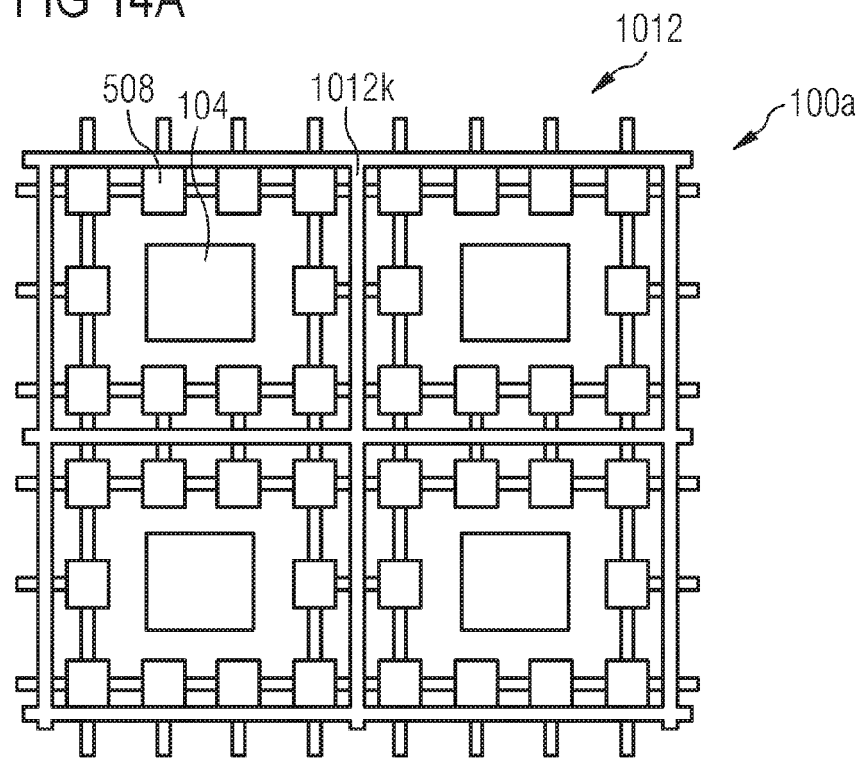
FIGS. 14A to 14D show a package arrangement respectively in a schematic cross sectional view or side view at various processing stages during manufacture according to various embodiments.

Alternatively, as for example illustrated in FIG. 14A, a global metal lead-frame may be embedded into the first encapsulation material 102, wherein the global metal lead-frame is singulated after embedding (e.g. during backside grinding) and the singulated metal parts 508 may act as solder lands for different packages 1000.

According to various embodiments, the carrier 100*a* may be provided by the embedding the global metal lead-frame, wherein the global metal lead-frame may include all required metal blocks 508 connected with each other prior to embedding. The chips 104 (e.g. the electronic circuits 104) and the connected metal blocks 508 may be arranged in a x-y-pattern 1012, e.g. on the auxiliary carrier 702, before the chips 104 and the connected metal blocks 508 are embedded into the first encapsulation material 1012. According to various embodiments, the x-y-pattern 1012 may define or may provide singulation streets 1012*k* for singulation of the carrier 100*a* into individual packages 1000.

The carrier 100*a* (e.g. the recon wafer as described before) may be singulated into a plurality of packages 1000 (or in analogy into a plurality of package arrangements 100 as described before). In other words, the carrier 100*a* may include a plurality of electronic circuits 104 and, optionally, a plurality of electromechanical devices 106, and a plurality of metal blocks 508 being at least partially embedded into the first encapsulation material 102 at a first processing stage 1012*a*.

Figure 14B:
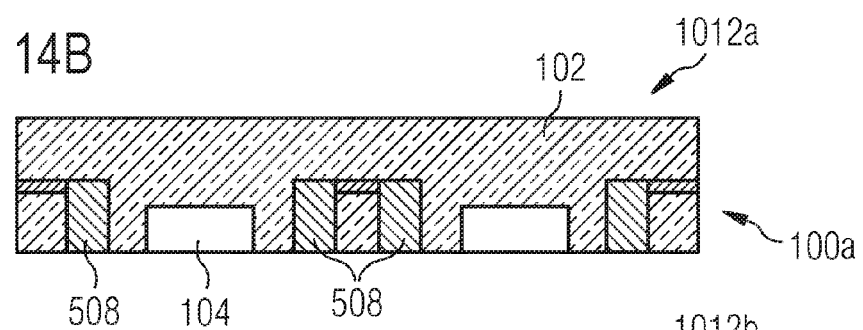
Figure 14C:
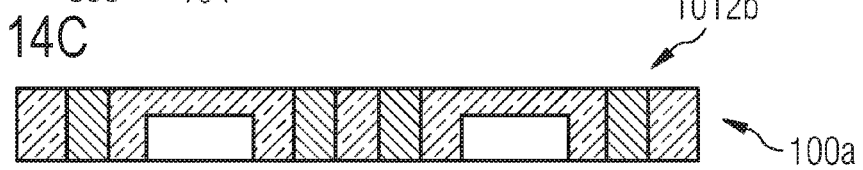
Figure 14D:
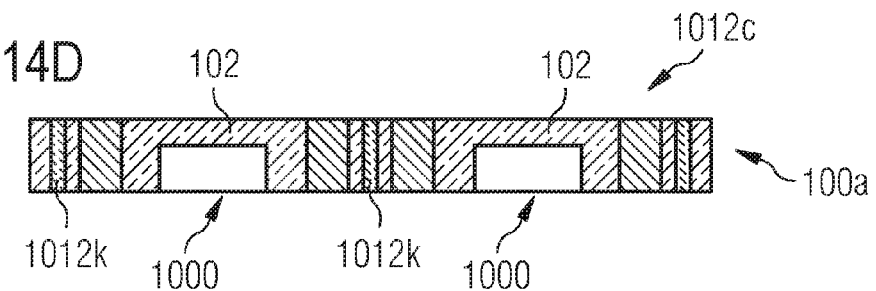

At the processing stage 1012*a* in FIG. 14B, the metal blocks 508 may be exposed at a front side of the carrier 100*a*. Further, as illustrated at a further processing stage 1012*b* in FIG. 14C, the carrier 100*a* may be ground from the backside of the carrier 100*a* to the desired thickness. During grinding, the global metal lead-frame may be singulated into individual metal blocks 508 being embedded into the first encapsulation material of the carrier 100*a*. Further, as illustrated at a further processing stage 1012*c* in FIG. 14D, the carrier 100*a* may be singulated into a plurality of packages 1000, e.g. along the singulation streets 1012*k*.

According to various embodiments, the package 1000 may be referred to as wafer level package (eWLP) or module. The carrier 100*a* may be referred to as recon wafer 100*a* or wafer level package (eWLP). The package 1000 may be singulated from the carrier 100*a* by means of dicing, e.g. sawing or chemically dicing.

According to various embodiments, a package arrangement may include: a first encapsulation material 102; at least one electronic circuit 104 at least partially embedded in the first encapsulation material 102, the at least one electronic circuit 104 may include a first contact pad structure 104*c* at a first side 104*a* of the at least one electronic circuit 104; at least one electromechanical device 106 (e.g. a MEMS, NEMS, e.g. a SAW device) disposed over the first side 104*a* of the at least one electronic circuit 104, the at least one electromechanical device 106 may include a second contact pad structure 106*c* facing the first side 104*a* of the at least one electronic circuit 104; a redistribution layer structure 108 between the at least one electromechanical device 106 and the at least one electronic circuit 104, the redistribution layer structure 108 electrically connecting the first contact pad structure 104*c* with the second contact pad structure 106*c*, wherein a gap 109 may be provided between the at least one electromechanical device 106 and the redistribution layer structure 108; a second encapsulation material 110 at least partially covering the at least one electromechanical device 106, wherein the gap 109 may be free of the second encapsulation material 110.

Further, the at least one electromechanical device 106 may include a surface acoustic wave chip.

Further, the redistribution layer structure 108 may include a wiring structure 1008*m*, 1008*v* for electrical routing and a shielding structure 1018*m* for electromagnetic shielding. Further, the shielding structure may overlap more than 50% of the at least one electronic circuit 104.

Further, the redistribution layer structure 108 may include a first redistribution layer 108*a* and a second redistribution layer 108*b* disposed on the first redistribution layer 108*a*. The second redistribution layer 108*b* may include a metal layer 1018*m* for electromagnetic shielding. The metal layer 1018*m* may overlap more than 50% of the at least one electronic circuit 104.

Further, the first contact pad structure 104*c* may include a plurality of first contact pads facing the redistribution layer structure 108.

Further, the second contact pad structure 106*c* may include a plurality of second contact pads facing the redistribution layer structure 108.

Further, the second encapsulation material 110 may cover a side of the at least one electromechanical device 106 facing away from the redistribution layer structure 108.

Further, the second encapsulation material 100 may partially cover the redistribution layer structure 108.

The package arrangement may further include: a sealing structure 306 disposed between the at least one electromechanical device 106 and the redistribution layer structure 108, the sealing structure 306 surrounding (in other words encircling) the gap 109.

The package arrangement may further include: a further redistribution layer structure 408 disposed over a second side 104*b* of the at least one electronic circuit 104 opposite the first side 104*a* of the at least one electronic circuit 104.

The package arrangement may further include: at least one via 508 extending through the first encapsulation material 102, wherein the further redistribution layer structure 408 and the redistribution layer structure 108 are electrically connected with each other by the at least one via 508.

The package arrangement may further include: at least one metal block 508 at least partially embedded into the first encapsulation material 102 and disposed next to the at least one electronic circuit 104, wherein the further redistribution layer structure 408 and the redistribution layer structure 108 are electrically connected with each other by the at least one metal block 508.

Further, the at least one electronic circuit 104 may include a driver circuit for the at least one electromechanical device 106.

Further, the at least one electronic circuit may include at least one electronic circuit of the following group of electronic circuits, the group consisting of: a low noise amplifier (LNA); an integrated passive device (IPD); an inductor; a resonator circuit.

Further, the at least one electromechanical device 106 may include an electronic filter, e.g. to modify a signal received from the at least one electronic circuit 104 and provide the modified signal to the at least one electronic circuit 104.

According to various embodiments, a package (in other words a recon wafer or a wafer level package) may include: an encapsulation material 102, at least one die 104 (or at least one electronic circuit 104), wherein the at least one die 104 may be at least partially embedded in the encapsulation material 102, the at least one die including a plurality of contact pads 104c at a first side 104a of the at least one die 104; at least one metal block 508 next to the at least one die 104 and at least partially embedded in the encapsulation material 102, the at least one metal block 508 extending through the encapsulation material 102; a redistribution layer structure 108 at the first side of the at least one die 104, the redistribution layer structure 108 electrically contacting the plurality of contact pads 104c and the at least one metal block 508.

Further, the redistribution layer structure 108 may include a wiring structure for electrical routing and a shielding structure 1018m for electromagnetic shielding.

Further, the at least one die may include solder at a second side 104b of the at least one die opposite the first side 104a.

According to various embodiments, a method of manufacturing a package arrangement 100 may include: at least partially embedding at least one electronic circuit 104 (e.g. a chip or a die) in a first encapsulation material 102, the at least one electronic circuit 104 including a first contact pad structure 104c at a first side 104a of the at least one electronic circuit 104; forming a redistribution layer structure 108 over the at least one electronic circuit 104, the redistribution layer structure 108 electrically contacting the first contact pad structure 104c; disposing at least one electromechanical device 106 (e.g. a MEMS, e.g. a SAW device) over the redistribution layer structure 108, the at least one electromechanical device 106 including a second contact pad structure 106c, the second contact pad structure 106c electrically contacting the redistribution layer structure 108, wherein a gap 109 is provided between the at least one electromechanical device 106 and the redistribution layer structure 108; at least partially covering the at least one electromechanical device 106 with a second encapsulation material 110, wherein the gap 109 remains free of the second encapsulation material 110.

The at least one electromechanical device 106 may be disposed over the at least one electronic circuit 104. The at least one electronic circuit 104 may include a terminal to connect the at least one electronic circuit 104 to an external antenna structure. Further, the at least one electromechanical device 106 may include a terminal to connect the at least one electromechanical device 106 to an external antenna structure. Further, the redistribution layer structure 108 may include a terminal to connect the at least one electronic circuit 104 and/or the at least one electromechanical device 106 to an external antenna structure.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A package arrangement comprising:
   a first encapsulation material;
   at least one electronic circuit device at least partially embedded in the first encapsulation material, the at least one electronic circuit device comprising a first contact pad structure at a first side of the at least one electronic circuit device;
   at least one electromechanical device disposed over the first side of the at least one electronic circuit device, the at least one electromechanical device comprising a second contact pad structure facing the at least one electronic circuit device;
   a redistribution layer structure between the at least one electromechanical device and the at least one electronic circuit device, the redistribution layer structure electrically connecting the first contact pad structure with the second contact pad structure, wherein a gap is provided between the at least one electromechanical device and the redistribution layer structure;
   a second encapsulation material at least partially covering the at least one electromechanical device, wherein the gap is free of the second encapsulation material.

2. The package arrangement according to claim 1; wherein the at least one electromechanical device comprises a surface acoustic wave chip.

3. The package arrangement according to claim 1; wherein the redistribution layer structure comprises a wiring structure for electrical routing and a shielding structure for electromagnetic shielding.

4. The package arrangement according to claim 1; wherein the redistribution layer structure comprises a wiring structure for electrical routing and a shielding structure for electromagnetic shielding.

5. The package arrangement according to claim 4; wherein the second redistribution layer comprises a metal layer to form an electromagnetic shield.

6. The package arrangement according to claim 1; wherein the first contact pad structure comprises a plurality of first contact pads facing the redistribution layer structure.

7. The package arrangement according to claim 1; wherein the second contact pad structure comprises a plurality of second contact pads facing the redistribution layer structure.

8. The package arrangement according to claim 1; wherein the second encapsulation material covers a side of the at least one electromechanical device facing away from the redistribution layer structure.

9. The package arrangement according to claim 1; wherein the second encapsulation material partially covers the redistribution layer structure.

10. The package arrangement according to claim 1, further comprising:
    a sealing structure disposed between the at least one electromechanical device and the redistribution layer structure, the sealing structure surrounding the gap.

11. The package arrangement according to claim 1; further comprising:
    a further redistribution layer structure disposed over a second side of the at least one electronic circuit device opposite the first side of the at least one electronic circuit device.

12. The package arrangement according to claim 11, further comprising:

at least one via extending through the first encapsulation material,
wherein the further redistribution layer structure and the redistribution layer structure are electrically connected with each other by the at least one via.

13. The package arrangement according to claim 11, further comprising:
at least one metal block at least partially embedded into the first encapsulation material and disposed next to the at least one electronic circuit device, wherein the further redistribution layer structure and the redistribution layer structure are electrically connected with each other by the at least one metal block.

14. The package arrangement according to claim 1;
wherein the at least one electronic circuit device comprises a driver circuit for the at least one electromechanical device.

15. The package arrangement according to claim 1;
wherein the at least one electronic circuit device comprises at least one electronic circuit device of the following group of electronic circuits, the group consisting of:
a low noise amplifier;
an integrated passive device;
an inductor;
a resonator circuit.

16. The package arrangement according to claim 1;
wherein the at least one electromechanical device comprises a surface acoustic wave device.

17. A method of manufacturing a package arrangement, the method comprising:
at least partially embedding at least one electronic circuit device in a first encapsulation material, the at least one electronic circuit device comprising a first contact pad structure at a first side of the at least one electronic circuit device;
forming a redistribution layer structure over the at least one electronic circuit device, the redistribution layer structure electrically contacting the first contact pad structure;
disposing at least one electromechanical device over the redistribution layer structure, the at least one electromechanical device comprising a second contact pad structure, the second contact pad structure electrically contacting the redistribution layer structure, wherein a gap is provided between the at least one electromechanical device and the redistribution layer structure;
at least partially covering the at least one electromechanical device with a second encapsulation material, wherein the gap remains free of the second encapsulation material.

* * * * *